United States Patent [19]

Waizman

[11] Patent Number: 5,317,202
[45] Date of Patent: May 31, 1994

[54] DELAY LINE LOOP FOR 1X ON-CHIP CLOCK GENERATION WITH ZERO SKEW AND 50% DUTY CYCLE

[75] Inventor: Alexander Waizman, Haifa, Israel

[73] Assignee: Intel Corporation, Santa Clara, Calif.

[21] Appl. No.: 890,038

[22] Filed: May 28, 1992

[51] Int. Cl.$^5$ .......................... H03K 5/13; H03K 5/04
[52] U.S. Cl. ..................... 307/269; 307/603; 307/262; 328/55; 328/155
[58] Field of Search ..................... 328/60, 14, 63, 155, 328/55; 302/265, 269, 526, 603, 605, 606, 262

[56] References Cited

U.S. PATENT DOCUMENTS

| | | | |
|---|---|---|---|
| 4,464,771 | 8/1984 | Sorensen | 328/63 |
| 4,494,021 | 1/1985 | Bell et al. | 307/526 |
| 4,795,985 | 1/1989 | Gailbreath, Jr. | 307/262 |
| 4,807,266 | 2/1989 | Taylor | 328/55 |
| 5,019,785 | 5/1991 | Fognini et al. | 328/14 |
| 5,097,489 | 3/1992 | Tucci | 328/55 |
| 5,101,117 | 3/1992 | Johnson et al. | 307/269 |
| 5,118,975 | 6/1992 | Hillis et al. | 328/55 |
| 5,157,277 | 10/1992 | Tran et al. | 328/63 |
| 5,216,302 | 6/1993 | Tanizawa | 307/603 |
| 5,223,755 | 6/1993 | Richley | 307/603 |
| 5,272,390 | 12/1993 | Watson, Jr. et al. | 307/269 |

Primary Examiner—Timothy P. Callahan
Assistant Examiner—Dinh Le
Attorney, Agent, or Firm—Blakely, Sokoloff, Taylor & Zafman

[57] ABSTRACT

In an integrated circuit for synthesizing a 50% duty cycle internal clock, the internal clock is synchronized with zero phase difference with respect to an external reference clock having the same frequency. The duty cycle of the synthesized waveform is fixed and invariant with respect to the reference clock duty cycle. Synchronization of the two clocks is achieved by a delay-line-loop using an inverting voltage controlled delay line with a nominal half period delay. The 50% duty cycle is achieved by a second control loop that has as its input both the reference and synthesized clock. This second loop also shares the voltage controlled delay line with the delay-line-loop.

7 Claims, 15 Drawing Sheets

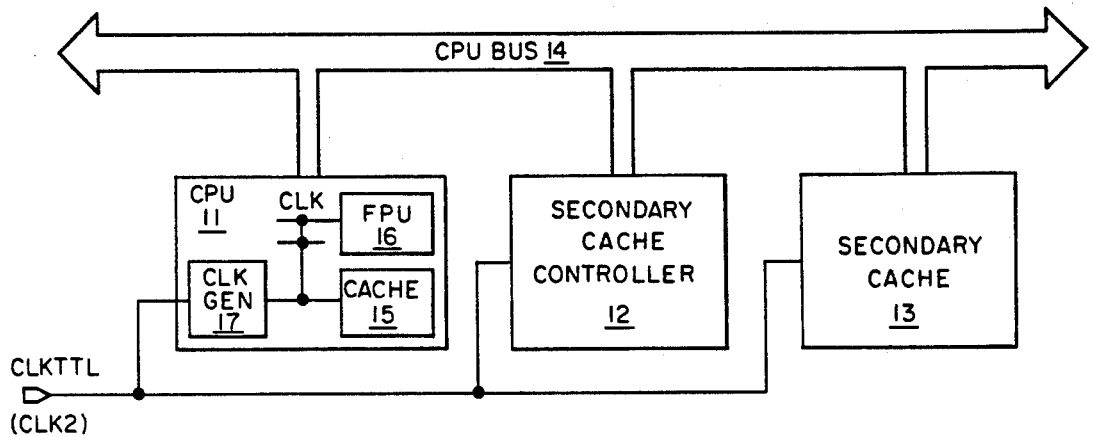
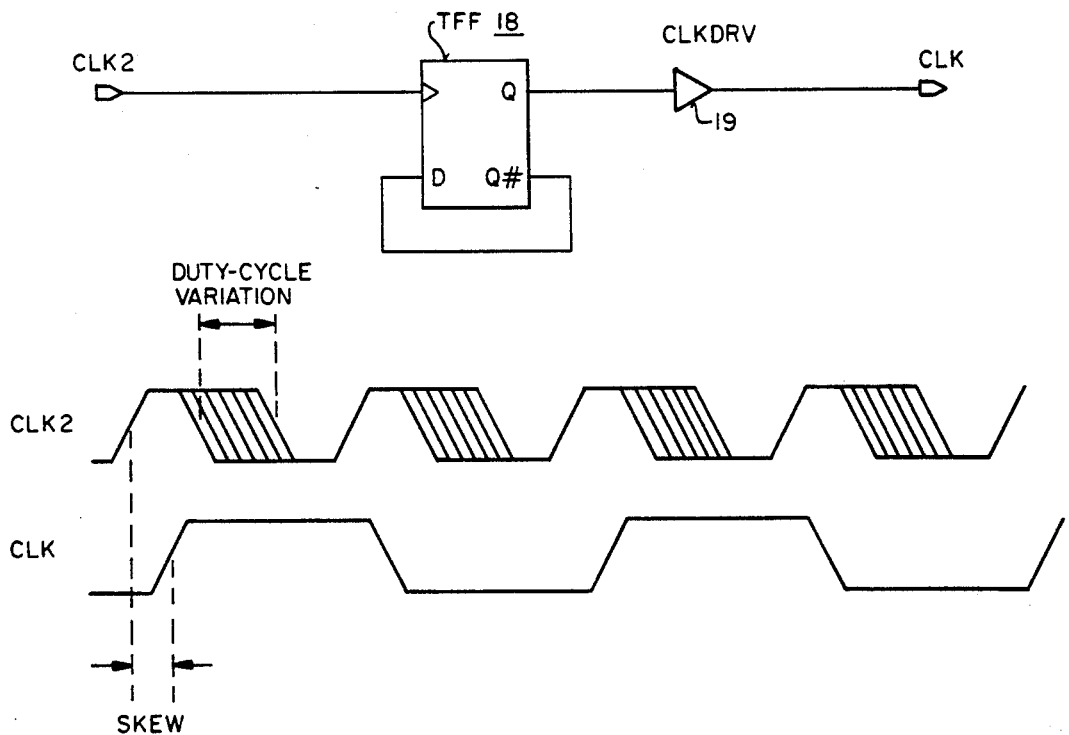

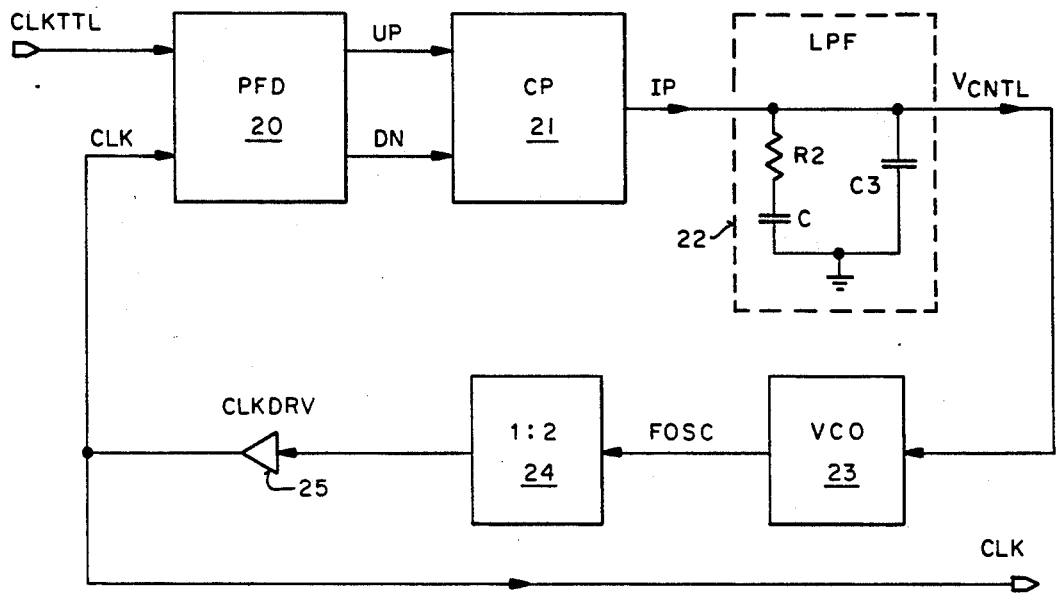
FIG_3 (PRIOR ART)
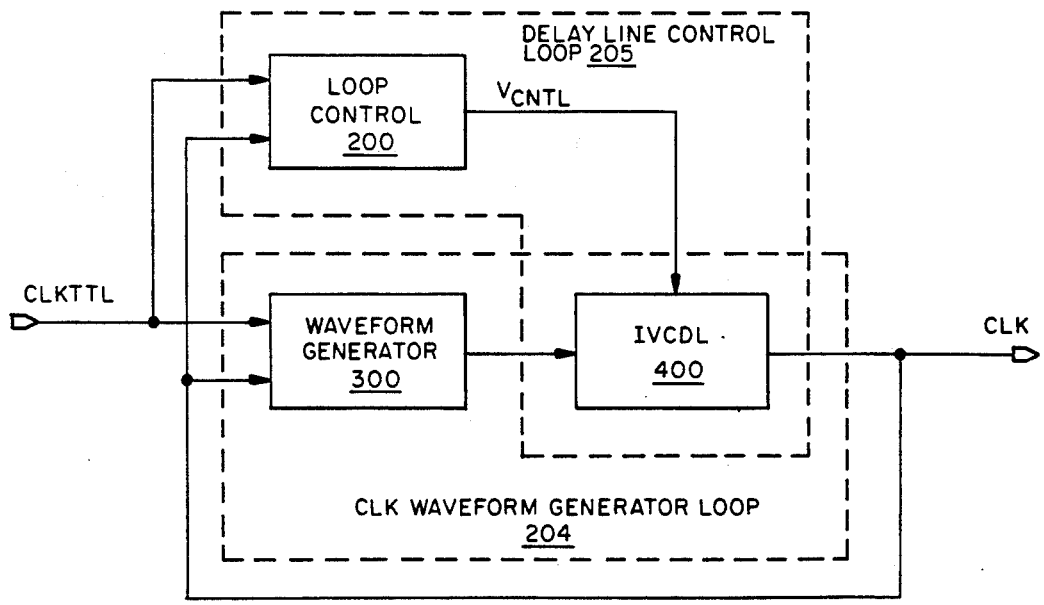
FIG_4

FIG _ 5
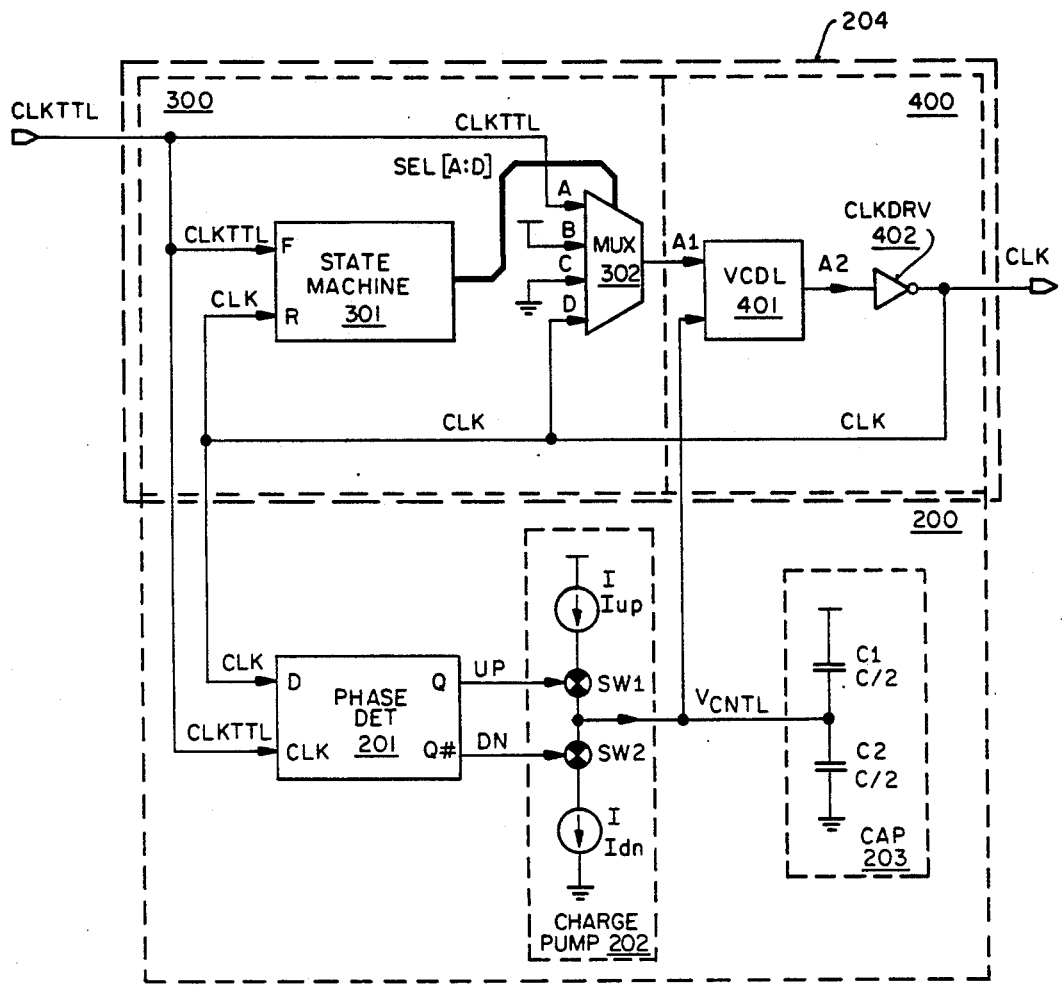
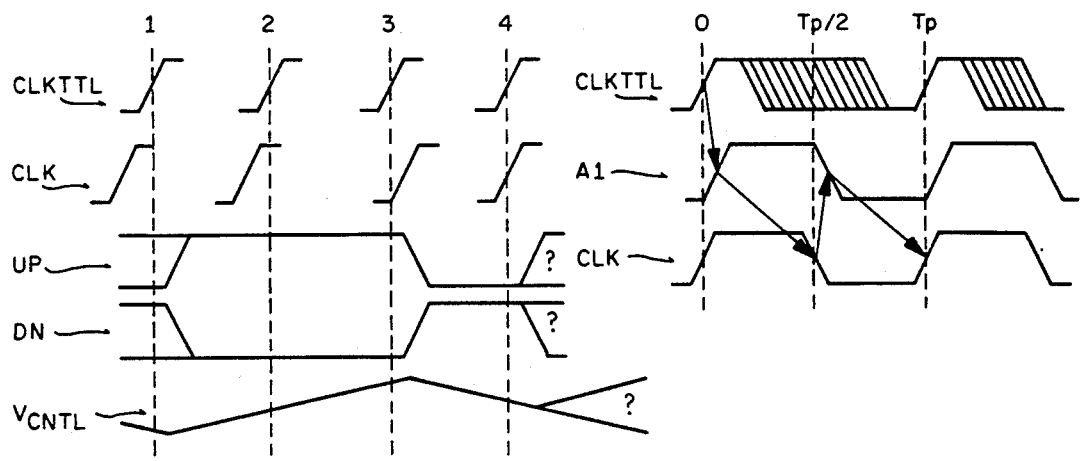

FIG_6
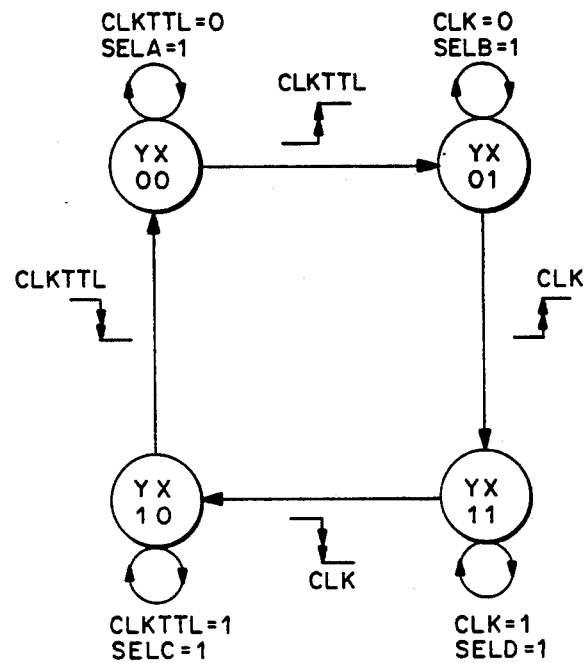
FIG_7
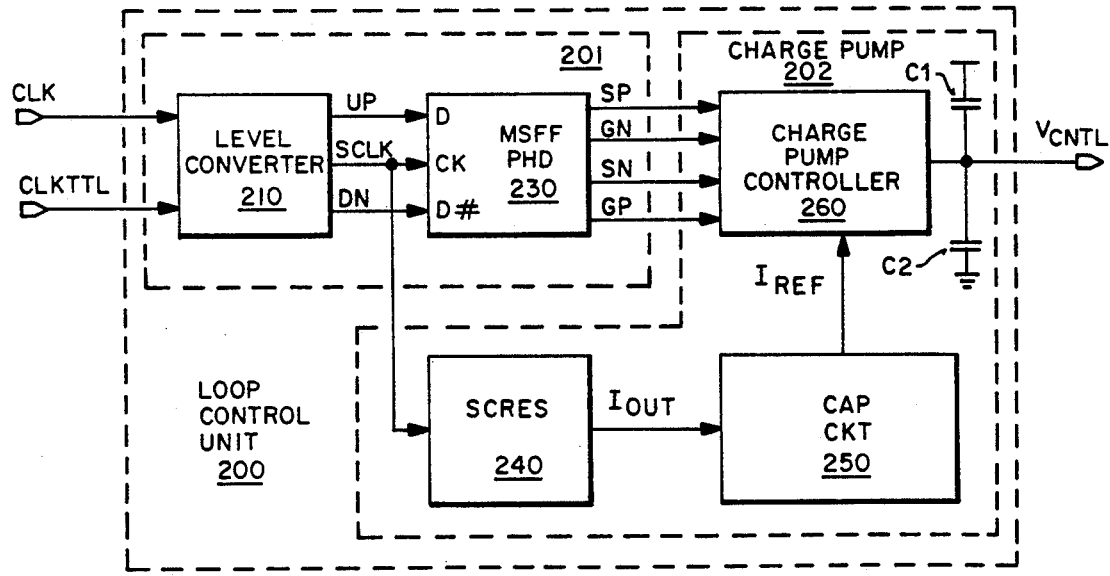

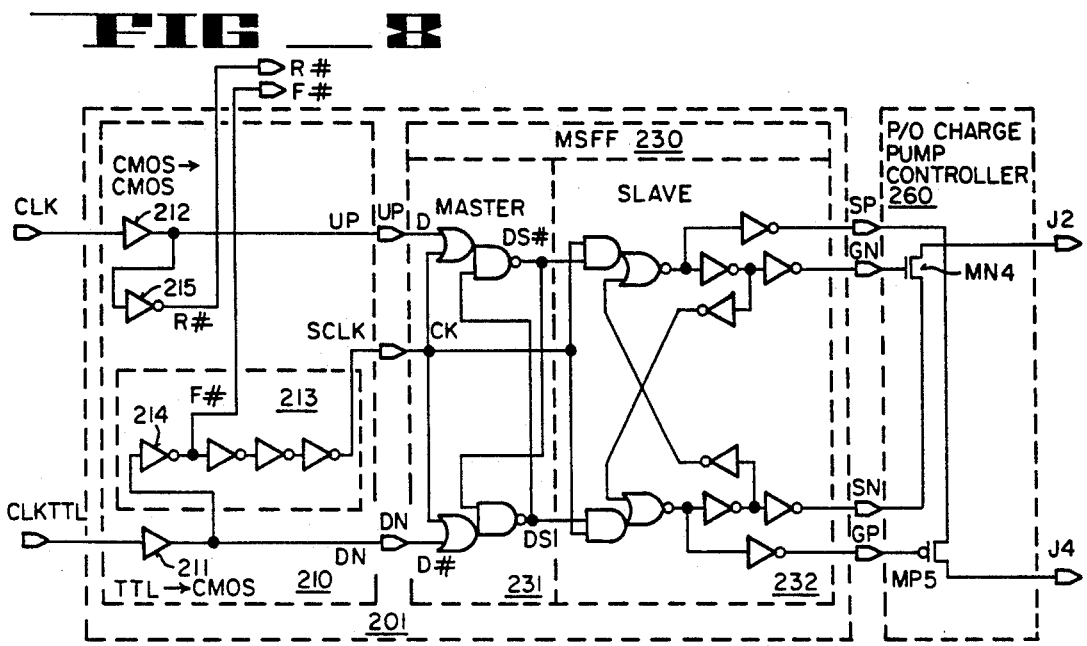
FIG_8
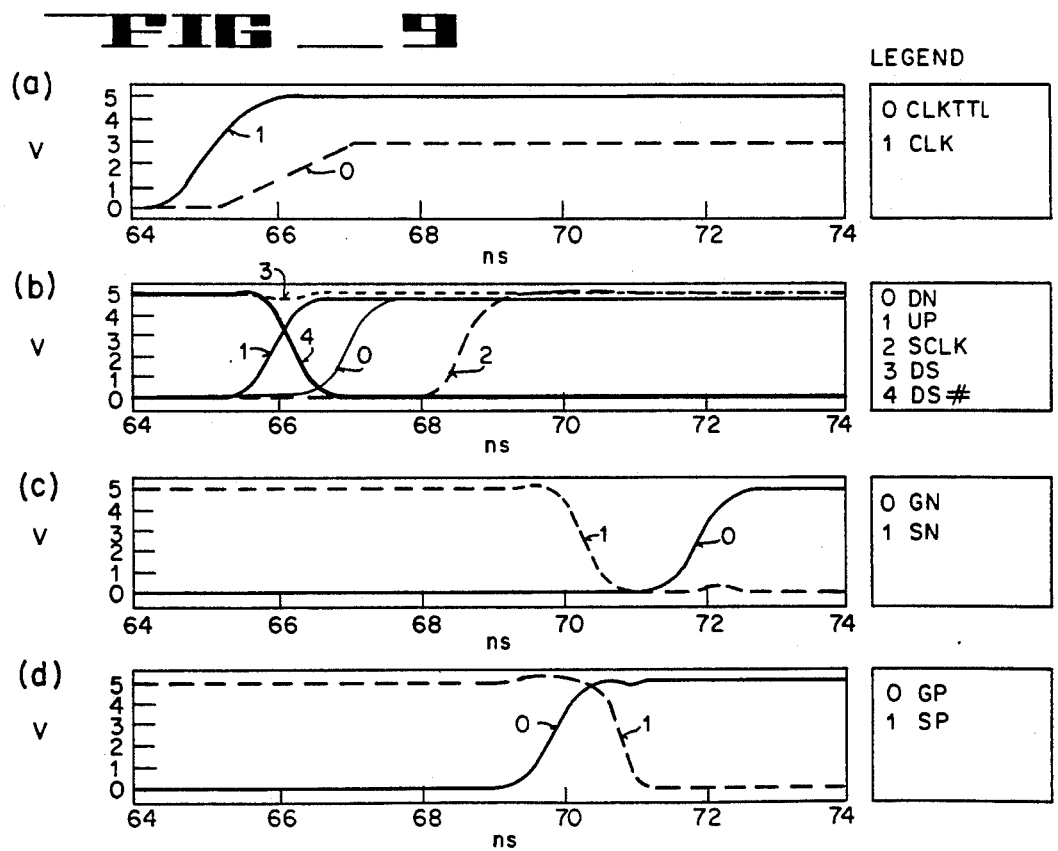
FIG_9

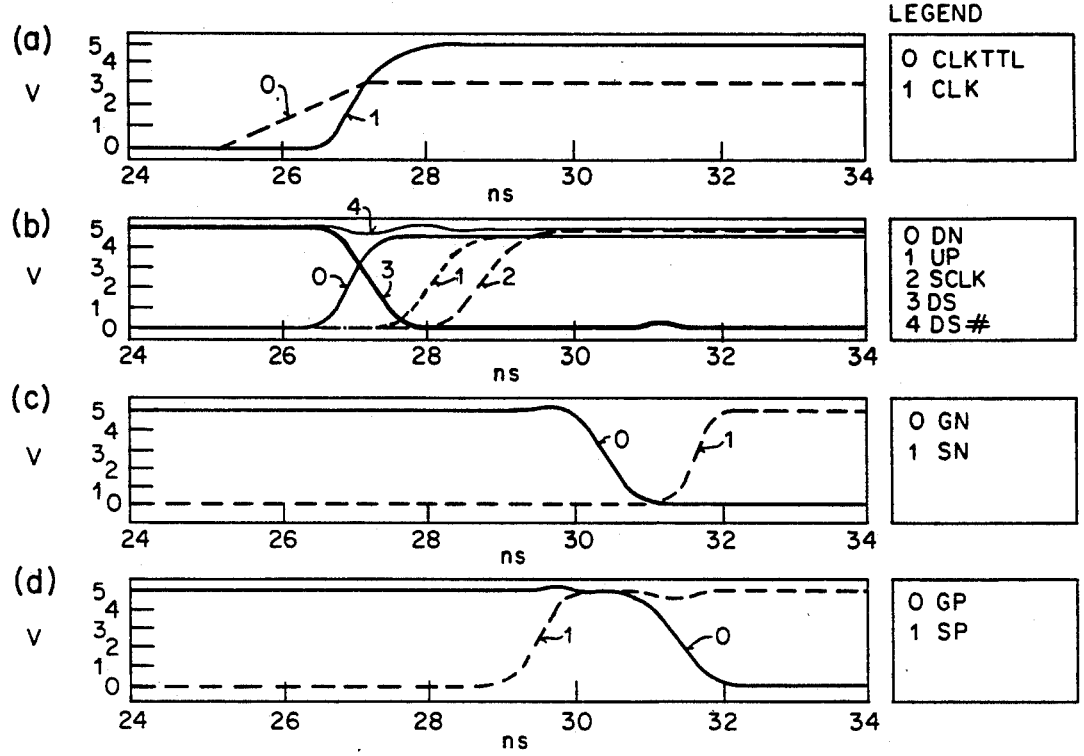
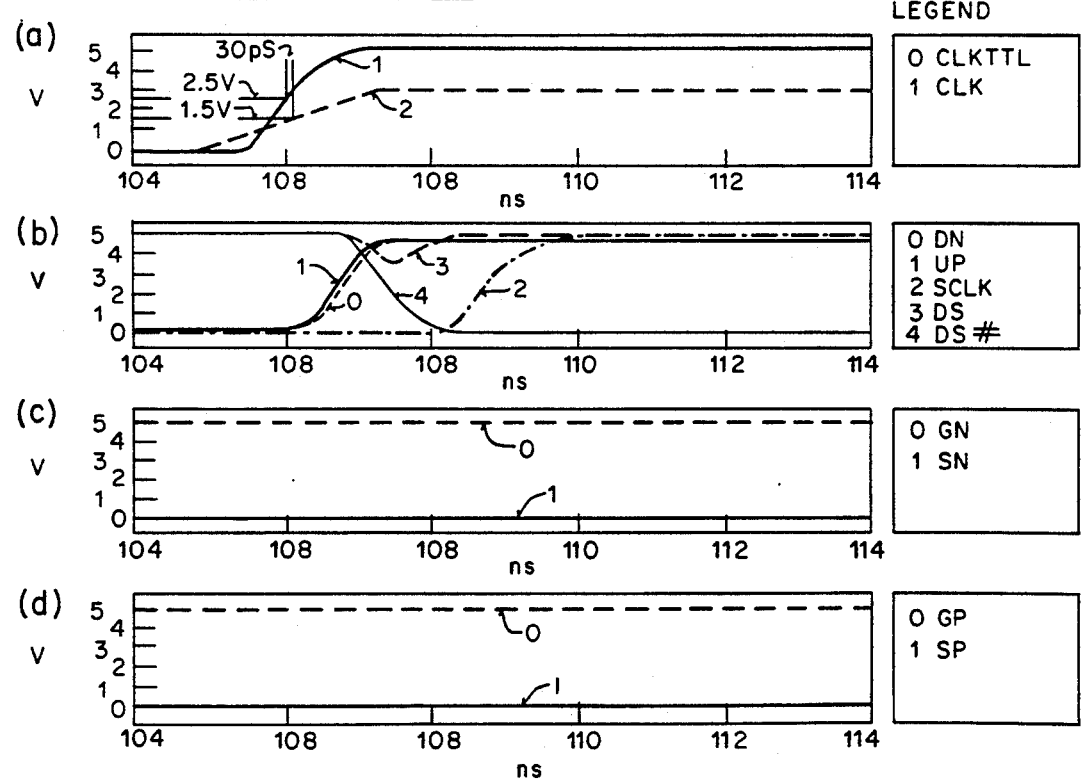

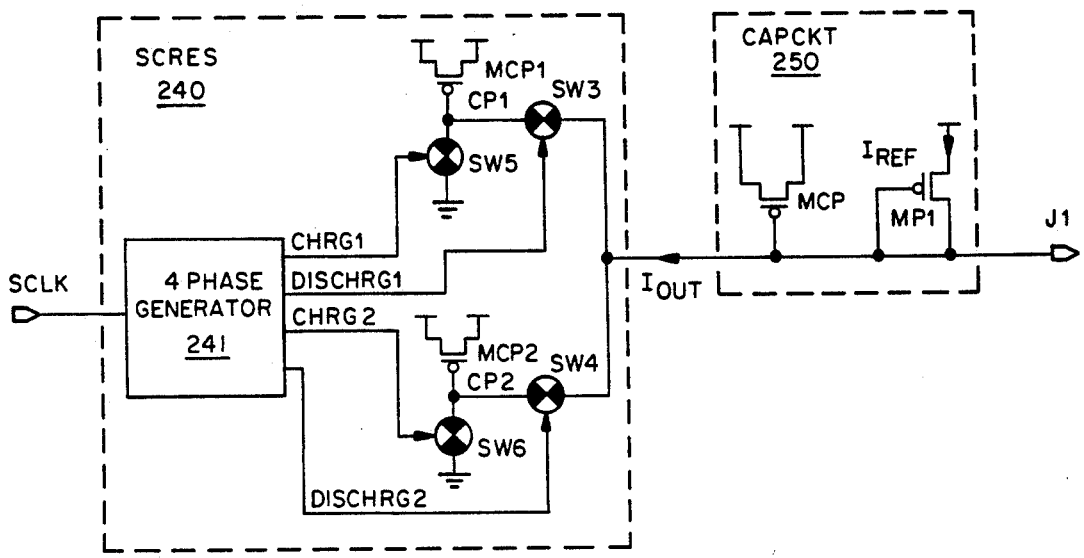
FIG_12
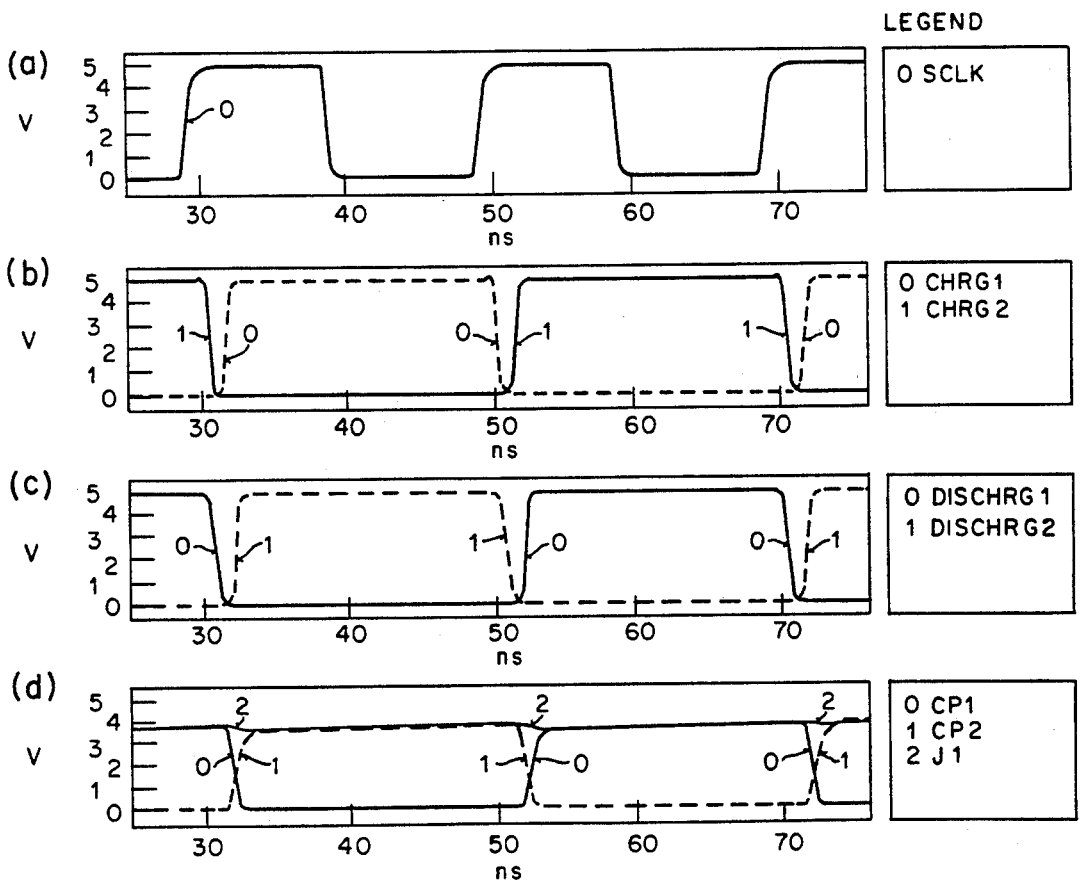
FIG_13

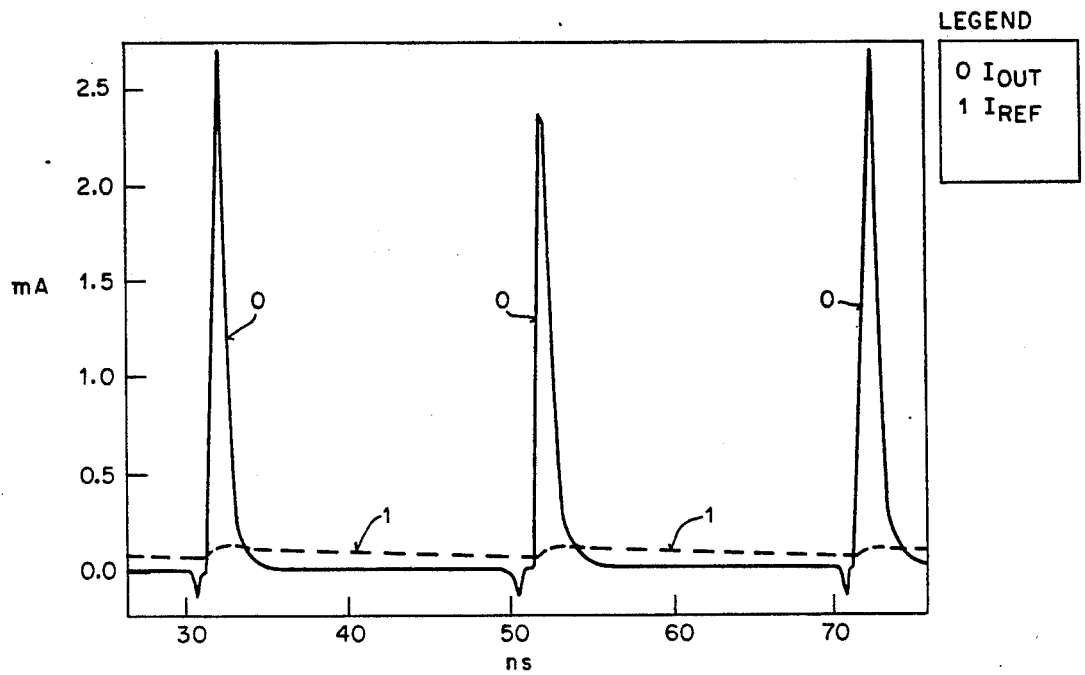
FIG _ 14
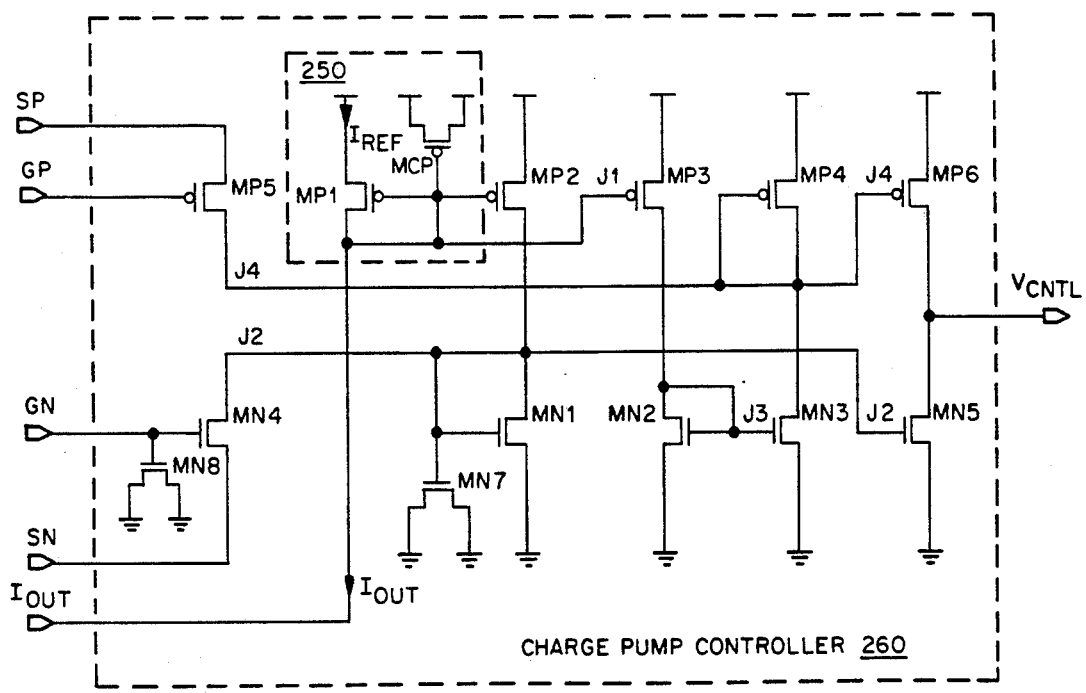
FIG _ 15

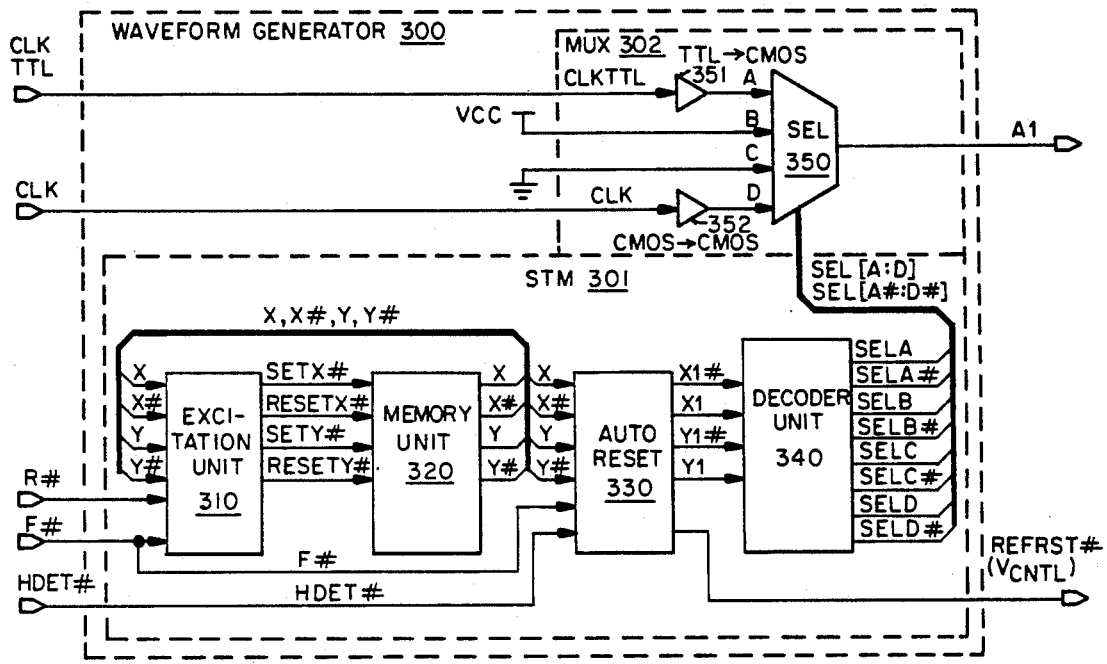
FIG_16
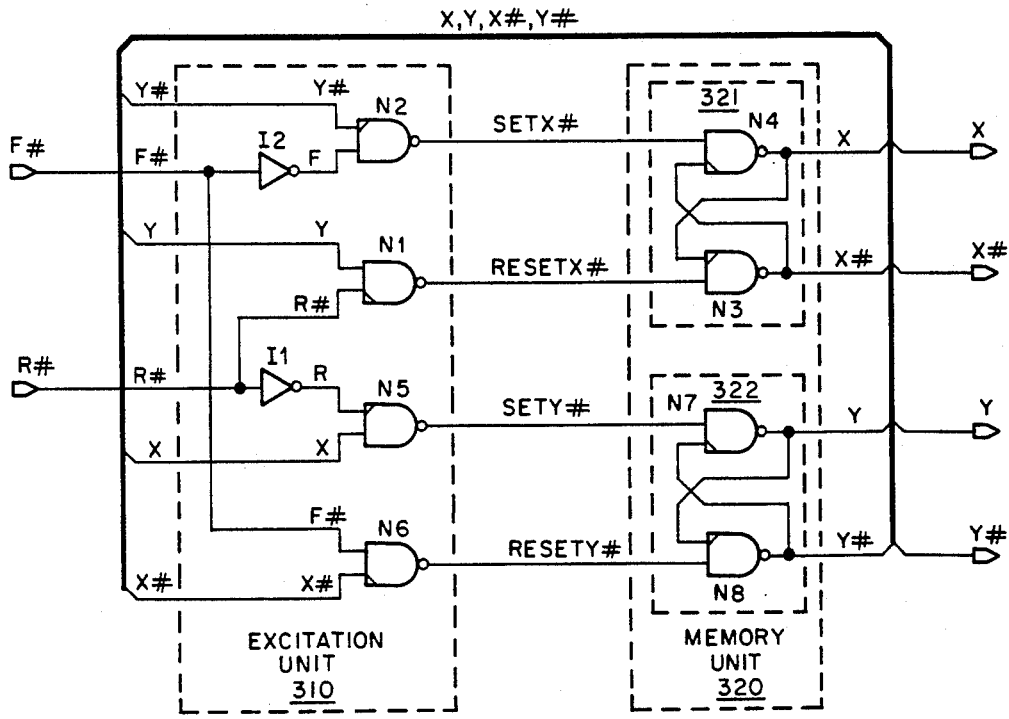
FIG_17

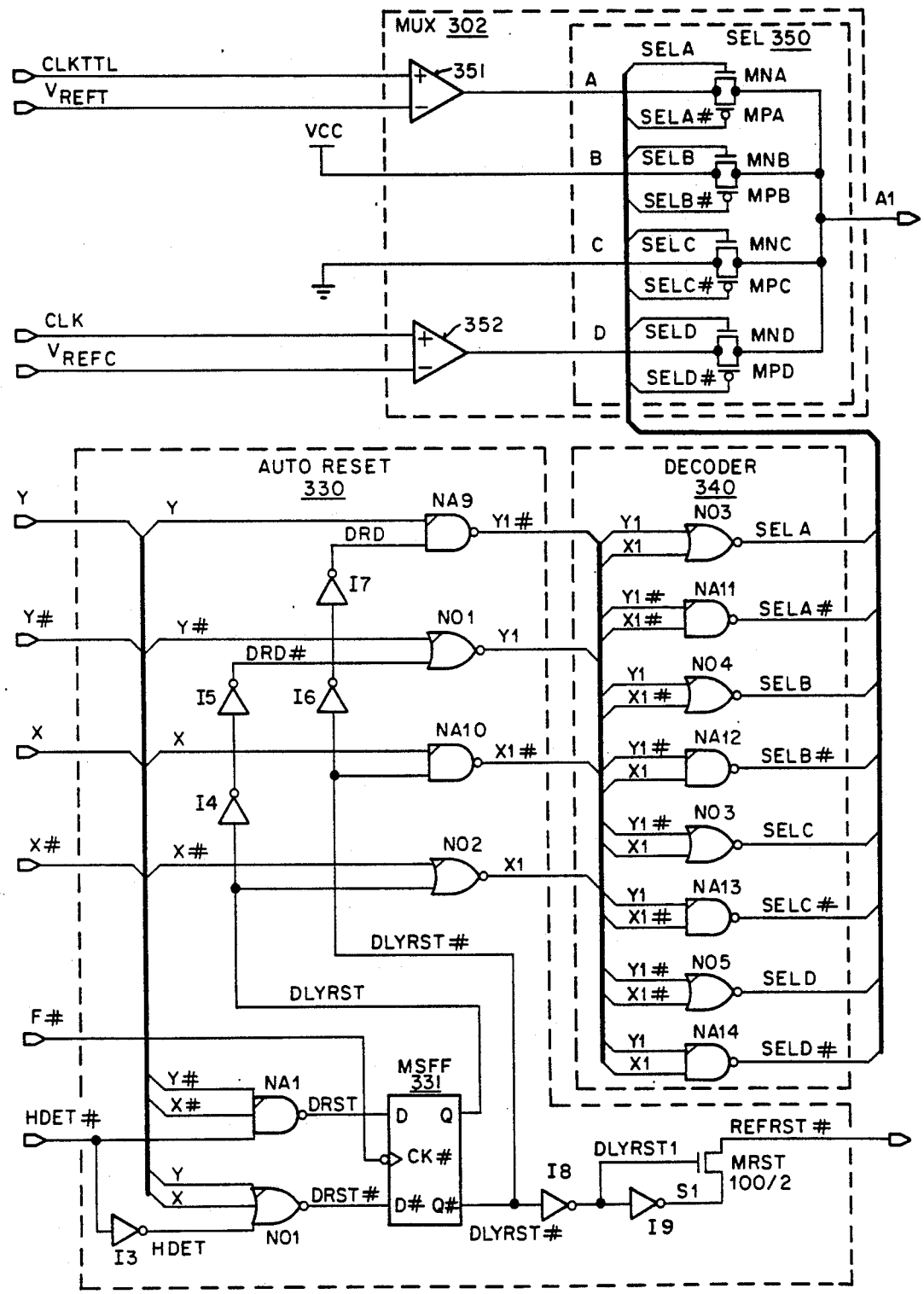
FIG _18

FIG. 19
(a)
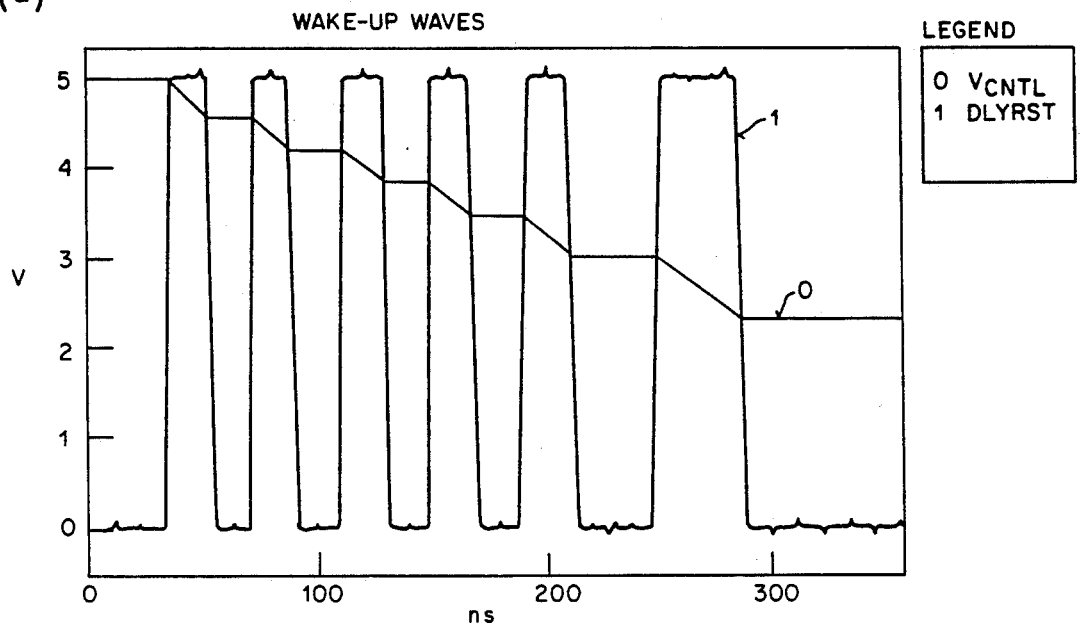
(b)
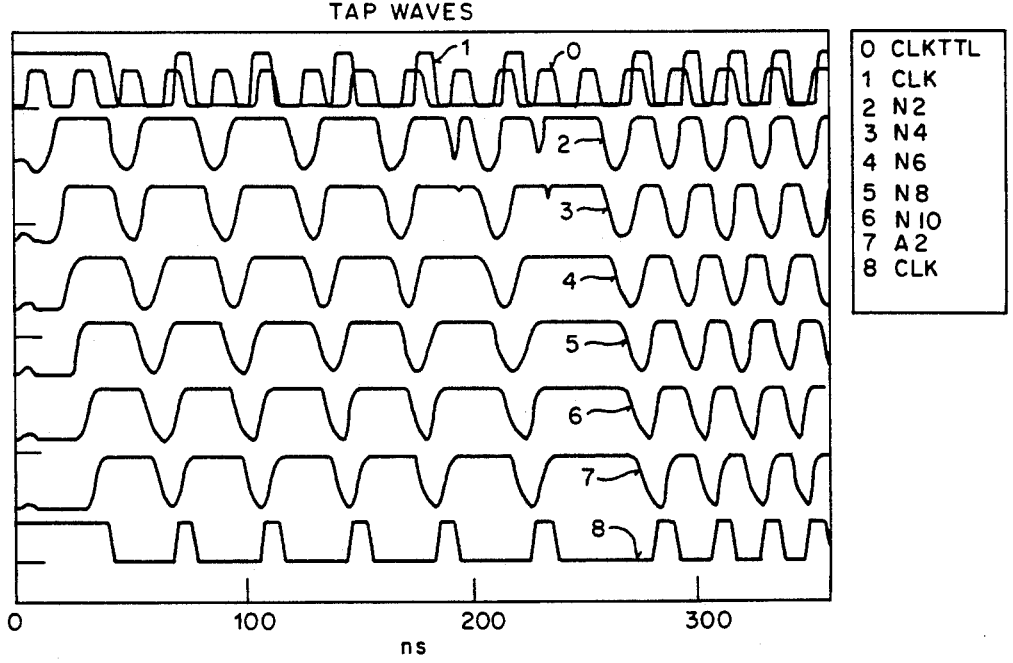

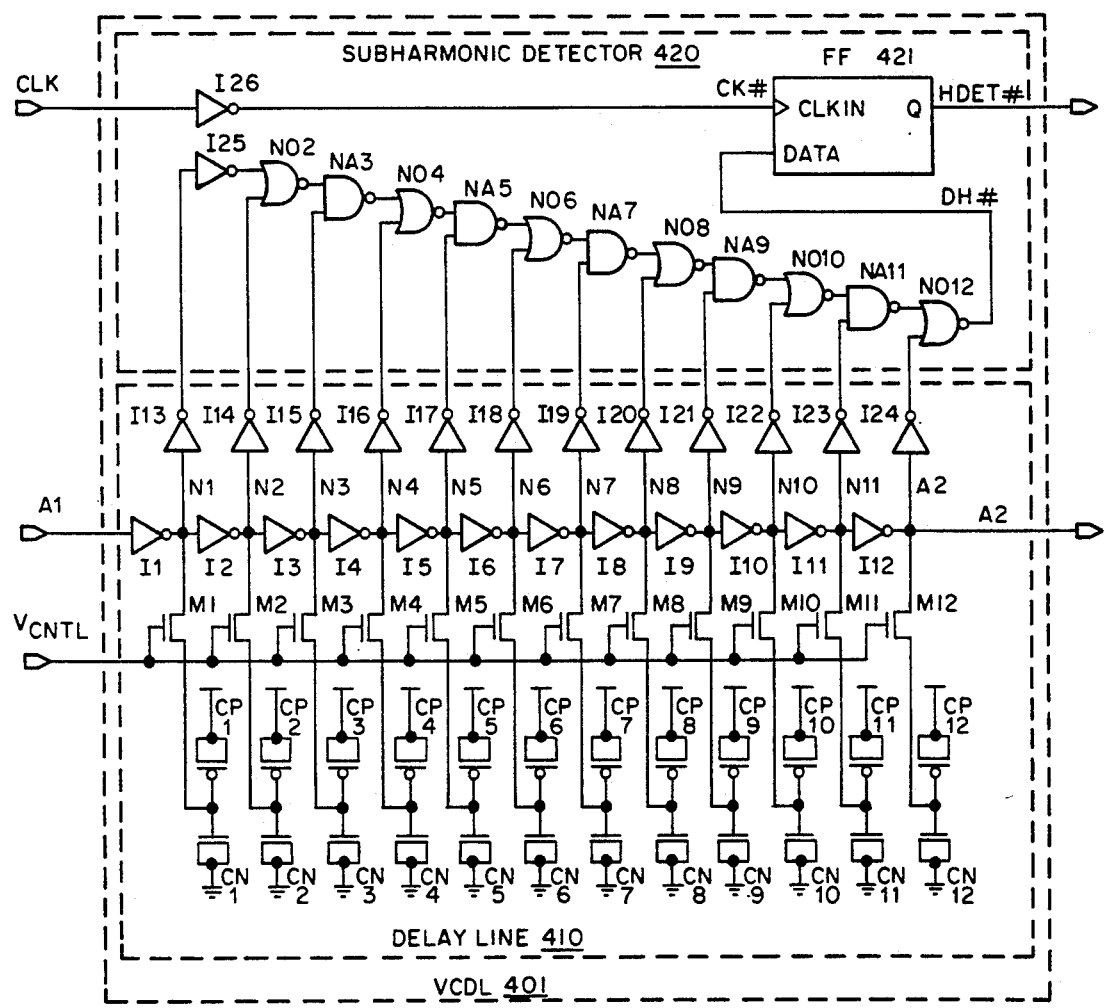
FIG_20

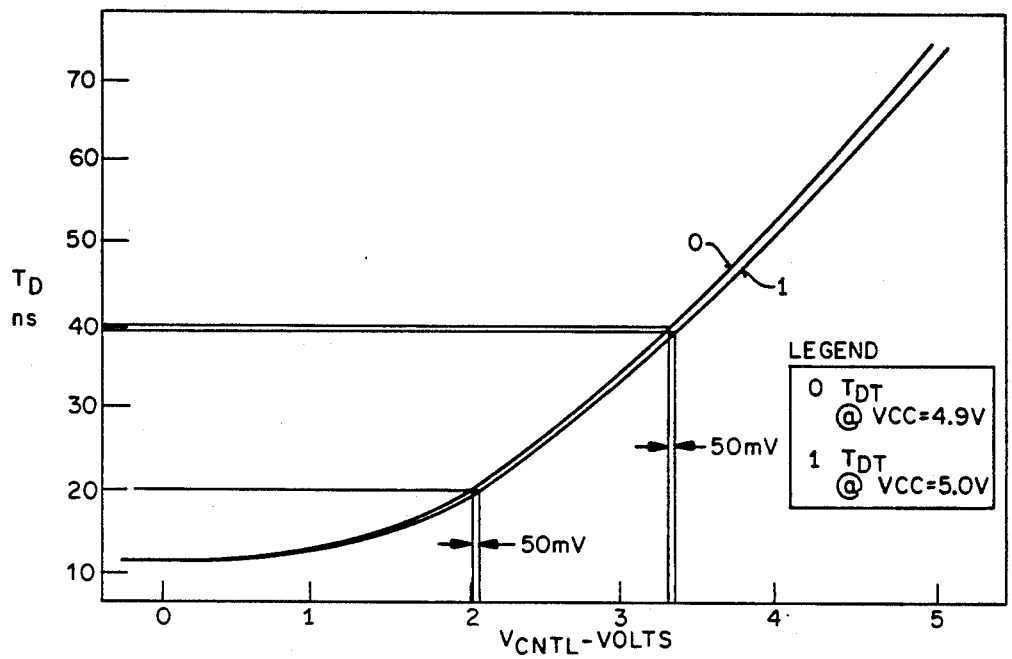
FIG_21
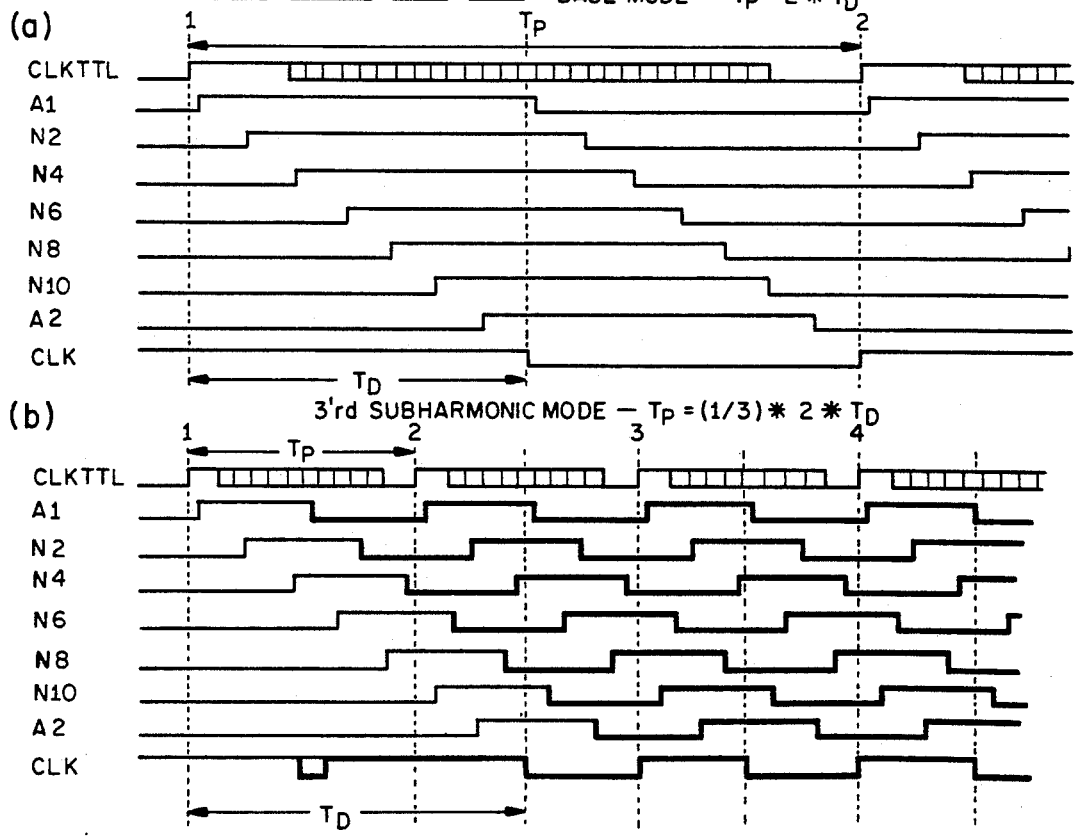
FIG_22

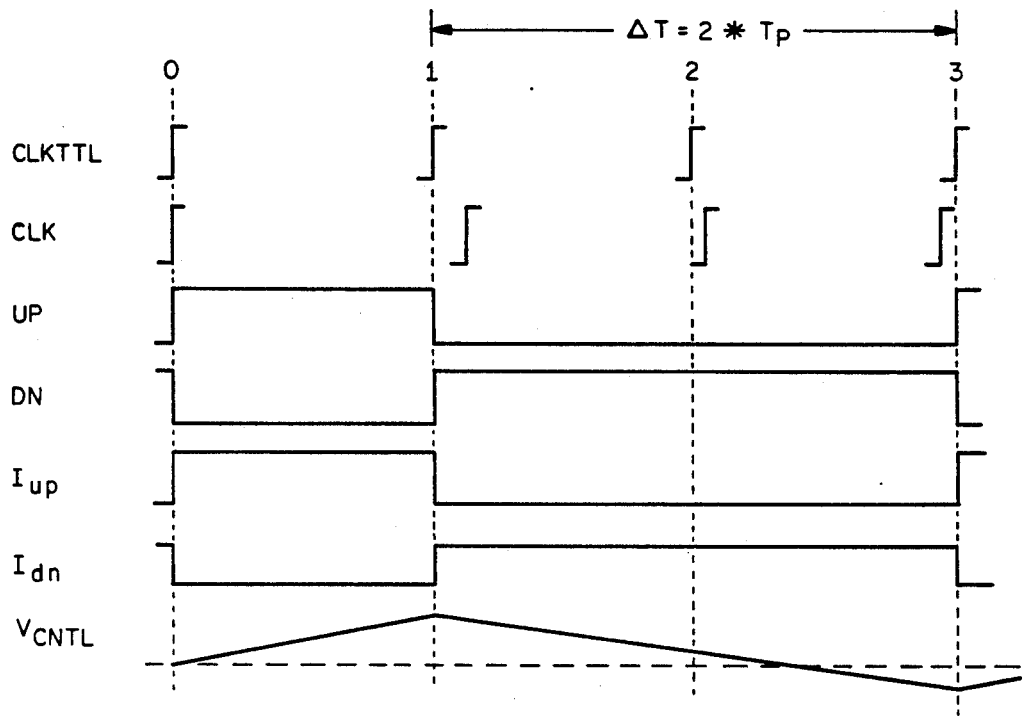
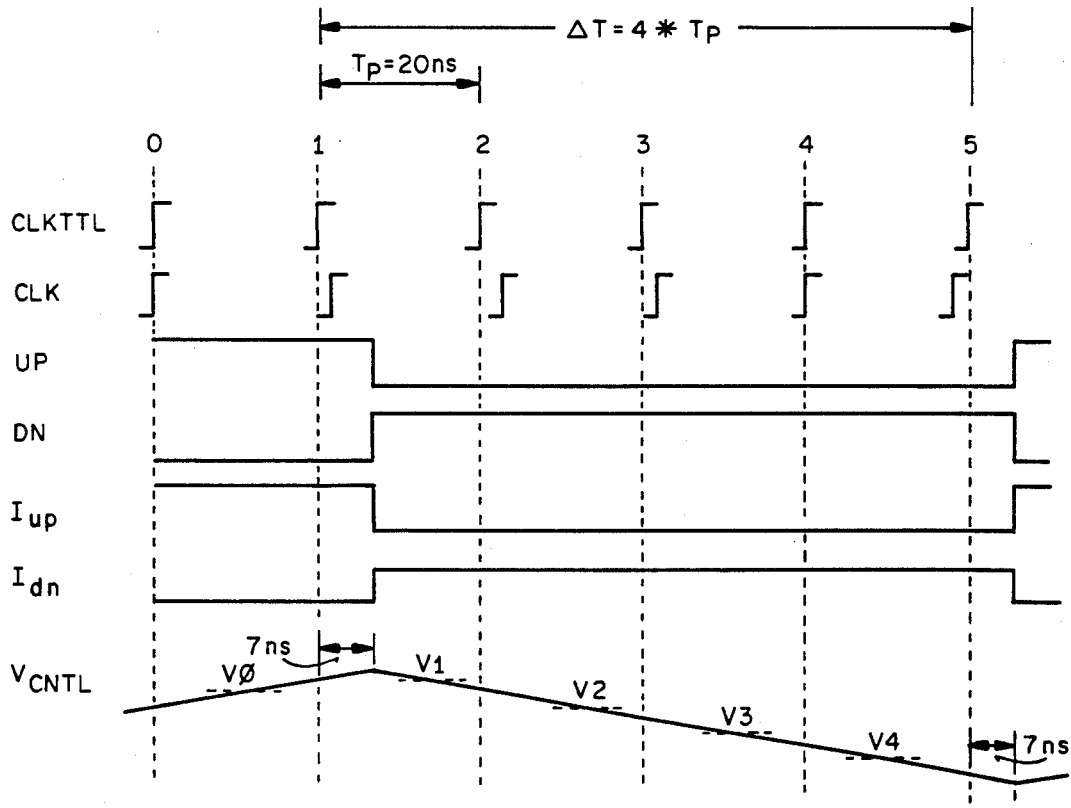

FIG_25

| STM STATE | INPUTS | | MEMORY | | | | AUTO-RESET | | | | DECODER-SWITCH | | | |
|---|---|---|---|---|---|---|---|---|---|---|---|---|---|---|
| | CLK | CLKTTL | Y# | Y | X# | X | Y1# | Y1 | X1# | X1 | SEL [A] | SEL [A#] | SEL [B] | SEL [B#] |
| PS 00 | X | 0 | 1 | 0 | 1 | 0 | 1 | 0 | 1 | 0 | 1=ON | 0=ON | 0=OFF | 1=OFF |
| TS | 0 | 1 | 1 | 0 | 1 | 1 | 1 | 0 | 0 | 0 | 1=ON | 1=OFF | 1=ON | 1=OFF |
| NS 01 | 0 | X | 1 | 0 | 0 | 1 | 1 | 0 | 0 | 1 | 0=OFF | 1=OFF | 1=ON | 0=ON |

PS = PRESENT STATE
TS = TRANSIENT STATE
NS = NEXT STATE
X = '0' OR '1' FOR CLKTTL AND CLK

DELAY LINE LOOP FOR 1X ON-CHIP CLOCK GENERATION WITH ZERO SKEW AND 50% DUTY CYCLE

FIELD OF THE INVENTION

The present invention relates to the field of generating clock signals required for sequencing the logic of integrated circuits, and in particular, for complementary-metal-oxide-semiconductor (CMOS) VLSI circuits.

BACKGROUND OF THE INVENTION

The core of a modern high speed microprocessor system, as shown in FIG. 1, consists of number of subsystems such as the microprocessor (CPU 11), secondary cache controller 12 and the secondary cache memory 13. The communication between the subsystems is performed over the CPU bus 14. Highly integrated modern VLSI processes, allows the CPU 11 to include an on chip primary cache 15 and floating point unit (FPU 16). The CPU 11 may generally include additional units that are not essential to the subject matter of this invention and are therefore omitted for clarity from FIG. 1.

Synchronous operation of the various units in the microprocessor system is accomplished by means of the CLK signal. Each unit uses the CLK signal for sequencing the operation of internal sequential logic circuits such as synchronous state machines. Inside CPU 11, the CLK is generated by the clock generator circuit (CLKGEN) 17. In the past, a double frequency (2×) clock signal, CLK2, was used as a main system reference clock. The CLK2 reference signal comprised a series of pulse waveforms with twice the frequency of the CLK signal ($F_{CLK2}=2*F_{CLK}$). FIG. 2 shows a typical prior art implementation of the CLKGEN circuit 17. The frequency of external CLK2 signal is divided by two by D-type flip-flop (TFF) 18 with its Q# output connected to its D input and buffered by a clock driver (CLKDRV) 19, creating the internal CLK signal with 50% duty-cycle, regardless of the duty-cycle of the external CLK2 signal. However, for modern microprocessor systems running at frequencies of 50 to 100 MHz CLK, the 2× clock frequency is 100 to 200 MHz. At these frequencies, designing the system distribution of the 2× clock is very complex, expensive and requires substantial skill in high frequency analog techniques. Moreover, at frequencies of 50 to 100 MHz, the 2 to 3 ns delay of the on-chip CLK driver constitutes a significant delay of 10 to 30% of the CLK period. These delays preclude the use of traditional means for CLK generation in modern microprocessors. A way to solve the problem is to use the 1× CLK signal as the system clock instead of the CLK2 signal. However, because of the need to have a 50% duty-cycle internal CLK signal with zero skew relative to the external clock signal, it is necessary to eliminate the delay of the internal clock driver 19. (To eliminate the confusion between the internal and the external clock signals, the external clock will be referred to as CLKTTL and the internal clock as CLK.)

One way to generate CLK with a 50% duty-cycle and zero skew between the external CLKTTL and the internal CLK signals is by using a phase-locked-loop (PLL), as shown in the block diagram of FIG. 3. The use of a sequential phase-frequency detector (PFD) 20 and Charge-Pump (CP) 21 in the PLL results in zero skew between the CLK and CLKTTL signals. The 50% duty-cycle is realized by using voltage controlled oscillator (VCO) 23 oscillating at twice the CLKTTL frequency and then dividing its frequency by two using frequency divider network 24 which is similar to divider network TFF 18 of FIG. 2. Further details about charge pump PLLs may be found in Gardner, F., *Phaselock Techniques* (John Wiley, 1979).

However, implementation of a PLL circuit using a digital VLSI process and operation of a PLL on the same substrate with noisy digital (on-off) circuits such as microprocessors, introduces further complications. The PLL analog circuit performance and reliability is adversely affected by this digital noise. The degree of sensitivity to noise is strongly affected by manufacturing process variations and by operating conditions. On the other hand, the digital parts of the microprocessor system are more robust than the analog parts of the PLL, showing greater immunity to process and environmental variations. Hence, reliable operation of PLL circuit on the same substrate with digital microprocessor, is very difficult to guarantee.

As can be seen from FIG. 3, the PLL's low pass filter (LPF) 22 uses a resistor R2 which is required to assure closed loop stability of the PLL. Unfortunately, modern digital VLSI processes lack the ability to provide reasonably valued resistors unless a well type resistor is used for R2. However, well-type resistors have high parasitic capacitance to the silicon substrate. In digital chips, like a microprocessor, this leads to coupling of the substrate noise to the sensitive LPF 22 output node $V_{CNTL}$. Noise on node $V_{CNTL}$ has a deleterious effect on operation of the PLL because it directly modulates the phase and frequency of the CLK signal. Hence, the zero skew locking of the PLL is subject to significant errors due to the substrate noise coupling.

In addition, it can be shown that the oscillation frequency of the VCO is highly sensitive to the power supply voltage noise. When the digital part of the microprocessor is operating, a very high noise level is generated on the internal power supplies of the chip due to on-off transients which significantly modulates the phase of the CLK signal. Consequently, the zero skew locking of the PLL can not be guaranteed due to noisy power supplies. One may suggest a separate set of filtered power supplies, solely for the PLL circuit on the microprocessor chip. However, use of isolated power supplies raises serious electro-static-discharge (ESD) reliability problems in addition to requiring additional filtering components external to the chip.

Therefore, it is undesirable to implement a mass production PLL circuit, residing on same substrate with the noisy digital circuits, which must be guaranteed to operate reliably but was manufactured by using a standard digital VLSI process.

SUMMARY OF THE INVENTION

A method and apparatus for on chip generation of 1×, 50% duty-cycle CLK signal, synchronized with zero phase difference with respect to an external reference CLKTTL signal, is described. The circuit is intended to be used in the harsh environment of modern CMOS VLSI microprocessors and associated peripheral integrated circuits.

A simplified block diagram of the apparatus is shown in FIG. 4. The apparatus comprises a CLK waveform generator loop 204 and a delay line control loop 205.

The object of the CLK waveform generator loop is to synthesize the 50% duty-cycle CLK waveform. The 50% duty-cycle of the synthesized CLK is invariant with respect to the duty cycle of the external CLKTTL signal. The object of the delay line control loop 205 is to synchronize (with zero phase difference) the internal CLK signal with an external CLKTTL signal.

The 50% duty-cycle of the CLK signal is generated as follows: the rising edge of the external CLKTTL signal is routed by waveform generator 300, to the input of inverting voltage controlled delay line (IVCDL) 400. At lock condition, the delay of IVCDL is nominally equal to a half period of the CLKTTL signal.

After being delayed by a half CLKTTL period in IVCDL 400, the rising edge of the CLKTTL signal, creates a falling edge of the CLK signal because of the inversion caused by IVCDL 400. Waveform generator 300 recirculates the falling edge of the CLK signal into the input of IVCDL 400. This time, the falling edge of the CLK signal is delayed by a half CLKTTL period inside IVCDL 400 creating the rising edge of CLK signal because of the inversion in IVCDL 400. Hence, the total delay from the CLKTTL rising edge to the CLK signal rising edge is one CLKTTL period. Also, as the rising and the falling edges propagate inside the same hardware of IVCDL 400, the 50% duty-cycle of the CLK signal is guaranteed by design.

Delay line control loop 205 assures that rising edges of the CLKTTL and CLK signals occur simultaneously. By comparing the phase or time difference in the rising edges of the CLKTTL and CLK signals, loop control unit 200 generates a voltage, $V_{CNTL}$, that controls the delay of IVCDL 400. The $V_{CNTL}$ is adjusted by loop control unit 200 to be at a value that assures that the rising edge of the CLKTTL signal has a total delay of one CLKTTL period inside clock waveform generator loop 204.

Another object of invention is to provide a clock generation circuit that is more suitable for CMOS VLSI implementation through the elimination of resistors, externally filtered power supplies, and analog circuits such as operational amplifiers.

Another object is to save on-chip silicon area by use of a delay line with only half of the delay elements needed for achieving the same effect by prior art implementations.

Another object of the present invention is to provide an improved phase detector circuit with a narrow symmetric sampling window.

Another object is to provide a high noise immunity and manufacturing process independent switched capacitor charge pump circuit.

Another object is to provide an automatic self reset mode during power-up of the waveform generator state machine to ensure that the circuit is not stuck in a forbidden state.

Another object is to provide automatic means for detecting and correcting for excessive delay line lowpass filtering due to an excessively long transit time through the voltage controlled delay line.

Another object is to provide automatic means for detecting and eliminating subharmonic locking of the delay control loop so that the circuit always locks on the base mode of operation.

BRIEF DESCRIPTION OF THE DRAWINGS

FIG. 1 is a block diagram of a modern high speed microprocessor system.

FIG. 2 is a prior art divide-by-two CLK generator circuit together with a waveform timing diagram of the CLK2 and CLK signals.

FIG. 3 is a prior art block diagram of PLL circuit for 1× CLK generation.

FIG. 4 is a simplified block diagram of the present invention.

FIG. 5 is a more detailed block diagram of the present invention together with the associated waveforms.

FIG. 6 is the state diagram of the waveform generator state machine.

FIG. 7 is a block diagram of the loop control unit.

FIG. 8 is a logic diagram of the phase detector circuit.

FIG. 9 shows the phase detector waveforms when CLK leads CLKTTL.

FIG. 10 CLKTTL shows the phase detector waveforms when CLK lags CLKTTL.

FIG. 11 shows the phase detector waveforms when CLK and CLKTTL are in zero phase lock.

FIG. 12 shows a simplified switched-capacitor resistor (SCRES) network and capacitor circuit.

FIG. 13 shows the SCRES circuit waveforms.

FIG. 14 shows the input and output current waveforms of the capacitor circuit (CAPCKT).

FIG. 15 shows the charge pump controller circuit.

FIG. 16 shows the waveform generator block diagram.

FIG. 17 shows the excitation and memory units comprising the state machine (STM) circuit.

FIG. 18 shows the details of auto-reset, decoder and MUX circuits.

FIG. 19 shows a set of waveforms associated with the wake-up auto-reset control.

FIG. 20 shows the delay line schematics together with the subharmonic operation detection circuit.

FIG. 21 shows the delay line time delay characteristics as function of control voltage $V_{CNTL}$.

FIG. 22 shows delay line waveforms for base mode and third subharmonic mode operation.

FIG. 23 shows the effect of finite phase detector resolution on the inherent jitter.

FIG. 24 shows the effect of phase detector and charge pump circuit delay on the inherent jitter.

FIG. 25 is a table illustrating the state of various signals during the operation of one embodiment of the present invention.

DETAILED DESCRIPTION OF THE INVENTION

A. Overview

The purpose of the present invention is to synthesize a single phase clock signal, CLK, synchronized in phase and frequency to a reference clock signal, CLKTTL. Although the following description of the preferred embodiment may refer to a specific integrated chip implementation, it will be recognized by those versed in the art that the principles expounded are capable of other forms of implementation.

FIG. 5 is a more detailed block diagram of the network of FIG. 4, comprising: a loop control unit 200, a clock waveform generator 300 and an inverting voltage control delay line (IVCDL) unit 400.

Loop controller 200 comprises a phase detector 201, a charge pump 202 and a low pass filter or capacitor (CAP) unit 203. Its purpose is to provide an output control voltage, $V_{CNTL}$, to the 12 stage voltage control delay line (VCDL) 401 of delay unit 400. The inverting operation of IVCDL 400 is achieved by inverting clock driver (CLKDRV) 402. $V_{CNTL}$ is adjusted to a level that ensures that for every positive-going transition of input clock CLKTTL, available through MUX 302, delay unit 400 concurrently produces a positive-going transition at the output CLK node. This obtains when the total delay, $T_{DT}$, through delay unit 400 is equal to one CLKTTL period, $T_P$.

If the total delay, $T_{DT}$, is somewhat shorter than $T_P$, D-type flip-flop (DFF) 201, samples the D input at the rising edge of CLKTTL, and latches the CLK high state causing the Q (UP) output to be asserted and Q# (DN) de-asserted as shown in FIG. 5. The Q (UP) and Q# (DN) output signals control the action of charge pump (CP) 202 by respectively causing switch SW1 to close and SW2 to open. As a result, charge pump 202 causes capacitors C1 and C2 of CAP unit 203 to accumulate a positive charge during this period from the current injected by current source $I_{up}$ of charge pump 202, causing the CAP unit output, $V_{CNTL}$, to increase positively and consequently causing the time delay of VCDL 401 to increase. Conversely, if the total delay, $T_{DT}$, through delay unit 400 is shorter than $T_P$, phase detector 201 samples the CLK low state causing switch SW1 to open and SW2 to close. This causes current source $I_{dn}$ to discharge the capacitors of CAP 203 causing $V_{CNTL}$ to decrease, thus decreasing the time delay through VCDL 401.

Referring to the waveforms of FIG. 5, note that during initial lock acquisition, $V_{CNTL}$ will resemble a positive or negative going ramp. When the equilibrium (lock) condition is reached, the charge pump output current signal will tend to alternate between charge and discharge causing $V_{CNTL}$ to be smoothed into a triangle-like waveform. Consequently, each CLKTTL cycle, the actual delay experienced by CLK will tend to jitter about the desired delay, $T_{DT}=T_P$. The amount of jitter is controlled by the proper choice of current values ($I_{up}$ and $I_{dn}$) and the effective capacitance ($C=C_1+C_2$) of CAP unit 203.

In accordance with Coulomb's law: a change in $V_{CNTL}$ voltage, $\Delta V_{CNTL}$, over a time interval, $\Delta t$, and for a fixed charging current, I, is given by $$\Delta V_{CNTL} = I^*\Delta t/C \quad (1)$$

This relationship shows that $\Delta V_{CNTL}$, for fixed $I^*\Delta t$, may be arbitrarily reduced by increasing the value of capacitance, C. Because the delay in VCDL 401 is proportional to the control voltage ($V_{CNTL}$), the jitter, $\Delta T_{DT}$, experienced during lock conditions in the delay, $T_{DT}$, of unit 400 due to periodic switching of SW1 and SW2 is given by:

$$\Delta T_{DT} = K^*\Delta V_{CNTL} = K^*I\Delta t/c \quad (2)$$

where K is the sensitivity constant of VCDL 401 in units of seconds/volt.

Intuitively, at lock condition, the decision of the phase detector 201 should change every other CLKTTL cycle. In this case, the predicted jitter, $\Delta T_{DT}$, would be obtained by setting $\Delta t$ equal to $T_P$. However, in practice, there are factors that cause the jitter to have a basic period that is a multiple of 2 to 4 CLKTTL periods. Although not all of these factors are well understood at this moment, several known factors include: a) imbalance of the charge pump currents $I_{up}$ and $I_{dn}$; b) finite detection resolution of the phase detector 201; and c) finite propagation delay from the moment phase detector 201 samples a transition until switches SW1 and SW2 are completely switched. (A more detailed discussion, of the factors that degrade circuits' jitter performance, follow in section C.)

The phase detector circuit 201, together with the charge pump 202, apply a constant amount of correction (invariant with respect to the magnitude of the phase error) to the control voltage $V_{CNTL}$, as given by Equation (1). The sign of the correction is a function of the sign of the phase error detected in the previous CLKTTL cycle by the phase detector. In contrast with the operation of prior art PLLs (for small phase errors) where the amount of correction is proportional to the phase error magnitude detected by the phase detector causing an exponential wave shape for the control voltage during lock acquisition as opposed to the linear waveform shown in FIG. 5.

From the above explanation, it may be understood that closed loop stable operation (with controllable error) may be achieved in the described system by using a single capacitor of value $C=C_1+C_2$, in the loop filter connected between $V_{CNTL}$ and the negative power supply voltage, $V_{SS}$, in contrast with the filter, LPF 22, of the prior art. As will be shown in section B.3, the improved embodiment obtains better immunity to power supply noise by splitting the loop filter capacitor 203, C, into two equal capacitors: capacitor C1 connected between the positive power supply voltage, $V_{CC}$, and $V_{CNTL}$ node and, capacitor C2 connected between the $V_{CNTL}$ node and negative power supply $V_{SS}$. This type of split connection is not possible for the low pass filter components of LPF 22 due to the presence of the resistor R2.

At locked condition, the clock waveform generator loop 204 of FIG. 5 is designed to synthesize a 50% duty cycle square wave, CLK, at its output node by sensing the logical states of the CLKTTL and CLK signals at state machine (STM) 301 input terminals F and R, respectively. The outputs of STM 301, labeled SEL[A:D], select one of four input signals to MUX 302: CLKTTL at input A, $V_{CC}$ (5 v) at input B, $V_{SS}$ (0 v) at input C and CLK at input D. These four inputs provide the necessary waveform component ingredients required to synthesize the 50% duty-cycle output CLK signal. MUX 302 feeds the input to IVCDL 400 comprised of non-inverting twelve stage delay line VCDL, 401, and inverting CLK driver (CLKDRV) 402. CLK driver 402 provides the inverting operation of the IVCDL while providing sufficient drive to accommodate the load capacitance (50–250 pF) at the CLK output node.

STM 301 internal structure comprises two memory elements whose state variables are represented by binary variables X and Y. The logical states of the two input signals, CLKTTL and CLK, rotate the STM 301 through 4 states: YX=00, YX=01, YX=11, YX=01 and back to YX=00. By using a decoder, the STM 301 generates signal SEL[A:D] with four output states (0001, 0010, 0100 and 1000) from the logical states of the STM variables X and Y. Signal SEL[A:D] controls the selection of MUX 302 inputs in accordance with the state diagram of FIG. 6. The sequence of state transitions is as follows:

(1) State 00: Assume that STM 301 is initially in state YX=00 (or simply 00) causing the MUX control signal to be in state 0001 (SEL[A]), thus providing a low CLKTTL signal at the output of MUX 302.

(2) Transition to State 01: The rising edge of the CLKTTL signal (F input to the STM) rotates STM 301 from state 00 to state 01. Because it takes some time for the STM 301 to change its state from state 00 to state 01, the rising CLKTTL propagates into the input of VCDL 401. When STM switches to the 01 state, the SEL[B] input is selected, routing a high logic signal into VCDL 401 through the MUX input B. The CLKTTL signal is no longer needed for proper operation of the circuit until the beginning of the next CLKTTL cycle. The high state of the CLKTTL signal needs to be high only long enough to switch STM 301 from state 00 to state 01. Note also that smooth (transient free) switching is ensured from the A input to the B input of MUX 302 because both of the inputs are at the high logic level during the switching event.

(3) State 01: STM 301 remains in state 01 as long as CLK stays low.

(4) Transition to State 11: During the lock condition, STM 301 remains in state 01 for a brief interval, i.e., for the time for both CLK and CLKTTL to switch in unison to a high level causing STM 301 to go into state (5) State 11: In state 11 the SEL[D] control signal becomes active. This routes the CLK signal to the input of VCDL 401. Smooth switching is ensured because both the CLK signal at input D and input B are at the high logic state. STM 301 remains in state 11 as long as it takes for the rising edge of the CLKTTL signal to propagate through delay unit 400 and to produce a negative transition at its CLK output node. At lock, the nominal delay of the rising CLKTTL edge, due to propagation delays through MUX 302, VCDL 401, and CLKDRV 402, is $T_d = T_p/2$ (a half CLKTTL period) causing a falling transition at the output of inverting CLK driver 402.

(6) Transition to State 10: The falling CLK edge rotates STM 301 to the 10 state. However, because the transition from state 11 to state 10 takes time, the falling transition of the CLK signal succeeds to propagate through the D input of MUX 302 to the input of VCDL 401.

(7) State 10: In state 10 the SEL[C] (0100) control is active. Hence, the low logic level is routed through the C input of MUX 302 to the input of VCDL 401. It is sufficient that the CLK signal remain in the low logical state for only a short interval, that is, just long enough to ensure transition of STM 301 from the 11 state to the 10 state. This is especially important during wake-up. STM 301 remains in the 10 state as long as the CLKTTL signal is at the high logical state, a function of the CLKTTL duty cycle.

(8) Transition to State 00: As soon as the CLKTTL signal, present at the F input port of STM 301, returns to low, STM 301 returns to state 00, and the periodic state cycle is completed. Control signal SEL[A] is active again routing the CLKTTL through the A input of MUX 302 to the input of VCDL 401. Because the transition from state 10 to state 00 happens while the CLKTTL is low, a smooth transient free switching is ensured. STM 301 remains in state 00 until a new rising edge of the CLKTTL signal occurs. In locked condition, coincident with the new rising edge of CLKTTL, the previous falling edge of the CLK signal arrives at the inverting CLK driver output node of delay unit 400, thus producing a positive CLK transition. Because both the rising edge of the CLKTTL signal and the falling edge of the CLK signal propagate through the same delay unit 400, the two signals are delayed by the same delay, $T_d = T_p/2$. Hence the CLK signal is guaranteed by design to have a duty cycle of 50 which is invariant with respect to the duty cycle of the external CLKTTL signal.

Thus, delay unit 400 delays the CLKTTL signal rising edge to the CLK signal rising edge by a delay of Tp but using only one-half of the delay elements normally needed for achieving the same effect. Also, an added benefit obtains because the savings in silicon area resulting from using half the number of delay elements twice.

B. Detailed Circuit Description

B.1. Loop Control Unit 200

FIG. 7 is a further detailed block diagram of the preferred embodiment of loop control unit 200. Phase detector (PHD) 201 comprises an optional logic level converter 210 for adjusting CLKTL logic levels to be compatible with the CMOS implementations, and D-type master-slave flip-flop 230 for performing the phase comparisons. The four output signals (GP, SP, GN and SN) of PHD 230 control the operation of the charge pump controller 260 which alternatively routes positive or negative replicas of reference current, $I_{REF}$, into the $V_{CNTL}$ node of charge pump controller 260. The $I_{REF}$ current represents an averaged (smoothed) replica of the output current, $I_{OUT}$, of switched capacitor-resistance circuit (SCRES) 240. The averaging function is performed by CAPCKT 250.

The detailed phase detection circuit of FIG. 8 corresponds to phase detector 201 of FIGS. 5 and 7. In this preferred embodiment, the CLK and CLKTTL input signals are applied to logic level converter 210. CLKTTL is a TTL level signal (low level corresponds to 0–0.8 volts, high to 2.0–5.0 volts while CLK is a CMOS signal having a full swing of 0 to $V_{CC}$ volts. Input buffer 211 is a TTL to CMOS level translator that converts TTL levels to full $V_{CC}$ swing CMOS levels. The converted CLKTTL, labelled DN, is made available to the D# input of master-slave flip-flop (MSFF) 230. DN is also used for sequencing the master-slave operation of MSFF 230 after being delayed through four inverting buffers (one 214 and three concatenated inverting buffers 213) to produce the sequencing or sampling signal SCLK. The synthesized synchronous clock signal, CLK, is applied to buffer 212, and its output, UP, is fed to the D input of MSFF 230. The delay characteristics of buffer 212 are matched to those of buffer 211 in order to avoid delay skew between DN and UP. Additionally, DN and UP are used to supply the F# and R# inputs of STM 300, respectively, after passing each through one additional similar inverting buffer stage 214 and 215. If both CLK and CLKTTL were CMOS signals, unit 210 would reduce to a smaller unit including only inverters 213, 214, and 215. The D and D# inputs would be driven directly by the CLK and CLKTTL signals, respectively.

Phase detection is accomplished by using a master-slave D-type (edge triggered) flip-flop, MSFF 230, and the delayed sampling signal, SCLK. The actual phase comparison is performed between the UP and DN signals connected respectively to the D and D# inputs of MSFF 230. The UP signal is the D input; the DN signal is the D# input. This connection scheme results in a MSFF with a symmetric sampling window, i.e., set-up time is equal to hold time. Also, the sampling window, defined as the sum of the set-up and hold time, is extremely narrow (<30 ps) due to the use of forbidden state 00 at both data inputs of the NAND type cross-coupled flip-flop, as described below.

The operation of MSFF 230 involves three possible phase condition cases, shown in FIGS. 9, 10 and 11, and described as follows:

Case (1): Rising edge transition of the UP (CLK) signal precedes the rising edge transition of the DN (CLKTTL) signal as shown in FIG. 9(a) and (b), indicating that the delay through VCDL 401 is too short.

Prior to the positive transition of UP (t<65 ns), both DN and UP are low, forcing the DS and DS# outputs of master unit 231 to high. This low-low input is a so called "forbidden" input state for the NAND type cross-coupled flip-flop of master unit 231. However, after the positive transition of the UP signal, DN is low (65 ns<t<67 ns) forcing DS to high and DS# to low. This condition is latched in master unit 231 by the rising edge of SCLK at t=69 ns.

Note that this example shows the fine resolution of master unit 231. Waveforms of FIG. 9(b) illustrate that it is sufficient for DN to have a slight delay (~1 ns in the above example) relative to the UP signal in order to generate the correct DS and DS# outputs.

The rising edge of SCLK also latches the slave unit 232 so that GN and GP output nodes are high while SN and SP are low. This action turns-off transistor MP5 and turns-on MP4 (FIG. 15) in charge pump controller 260. [Consequently, the delay through VCDL 401 in FIG. 5 is increased.] Charge pump controller 260, is discussed below and is shown in more detail in FIG. 15.

Significantly, MSFF 230 produces four non-overlapping control signals: GN, GP, SN and SP as shown in FIG. 9(c) and (d). It will be shown in a following description of charge pump controller 260 that this feature beneficially results in high noise immunity operation of charge pump controller 260.

Case (2): Rising edge of UP (CLK) occurs after the onset of DN (CLKTTL) as shown in FIG. 10(a) and (b), indicating that the delay time through VCDL 401 is too long.

As in the previous case, the ~1 ns lag between DN and UP, as shown FIG. 10(b), resolves the "forbidden" state issue by causing output node DS to fall low and DS# to remain high. The output state is latched by the assertion of SCLK at t=29 ns. SCLK also latches GN and GP low and SN and SP high in slave unit 232, turning-on transistor MP5 and turning-off MP4 in charge pump controller 260, as shown in FIG. 10(c) and (d), causing a negative current to flow into the loop low pass filter CAP 203 (FIG. 5) and consequently decreasing the delay through VCDL 401.

Case (3): Both UP (CLK) and DN (CLKTTL) are low as shown in FIG. 11(a) and (b) and onset occurs simultaneously (zero phase difference). Because CLKTTL and CLK have different reference voltage levels (TTL vs. CMOS), the CLKTTL timing measurements are referred to the 1.5 volt crossing instant while the CLK timing measurements are referred to the ½ $V_{CC}$ crossing instant.

For this zero-phase-difference case, the behavior of MSFF 231 resembles meta-stable operation because the MSFF 230 output state after the onset of SCLK is not predictable. In this example, both DS and DS# begin negative transitions at t=107 ns, as shown in FIG. 11(b). Due to some mostly unpredictable imbalance or noise, master unit 231 resolves the conflict by forcing DS to high and DS# to low in this case. Consequently, slave unit 232 output states remain unchanged.

If the outcome had been resolved differently, a change in state would produce a change in delay through VCDL 401 causing a non-zero phase difference between UP(CLK) and DN(CLKTTL) for the next CLKTTL cycle and thereby returning to case (1) or (2) above.

FIG. 5 shows that the simplified functional version of charge pump 202 comprises switching means SW1 and SW2 as well as current sources $I_{up}$ and $I_{dn}$. These functions are performed by switched-capacitor resistance network SCRES 240, capacitance circuit CAPCKT 250, CAP 203 (=C1+C2) and charge pump controller 260 of FIG. 7.

FIG. 12 is a more detailed diagram of the SCRES circuit 240 which is synchronously driven by SCLK from level converter 210 of FIG. 7. As shown in FIG. 13(b) and (c), four phase generator 241 divides the rate of SCLK by two, creating four ~50% duty cycle non-overlapping waveforms: CHRG 1, CHRG 2, DISCHRG 1 and DISCHRG 2.

For purposes of explaining its operation, assume that nodes CP1 and CP2 are at 3.9 volts and 0 volts, respectively, (t<30 ns) as shown in FIG. 13(d). After the first rising edge of SCLK (t=30 ns), CHRG 1 and DISCHRG 2 are set high, while CHRG 2 and DISCHRG 1 are set low causing switches SW5 and SW4 to close and switches SW6 and SW3 to open. Consequently, the gate of transistor MCP1 at node CP1 falls to zero and the gate transistor MCP2 at CP2 charges to approximately 3.9 volts corresponding to $V_{CC}-2V_{TP}$, where $V_{CC}$ is nominally 5 volts and $V_{TP}$, the threshold voltage of MP1 connected as a "diode", is approximately 0.55 volts. Thus, the output node, J1, is effectively clamped by MP1 at 3.9 volts. On the next cycle at the rising edge of SCLK, the states of CHRG 1, DISCHRG 2 and CHRG 2, DISCHRG 1 are inter-charged, causing transistors MCP1 and MCP2 to exchange roles: the gate of MCP1 at node CP1 is charged to 3.9 volts and the gate of MCP2 at CP2 is charged to 0 volts.

The switching operation described above requires that waveforms CHRG1, CHRG2, DICHRG1, and DISCHRG2 be non-overlapping in order to avoid circuit malfunctions caused by the simultaneous closing of SW5 and SW3, or SW6 and SW4.

Consequently, for every SCLK cycle, either MCP1 or MCP2 are connected to node J1 and charged from 0 volts to 3.9 volts. This charging of MCP1 and MCP2 involves a charge packet transfer each SCLK cycle from capacitor MCP and transistor MP1 to either capacitor MCP1 or MCP2. Charge transfer per unit time period (SCLK cycle) is defined as electrical current. Hence, there exists current flow, $I_{OUT}$, through the terminal connecting SCRES 240 and CAPCKT 250. This current has a pulsating nature as shown in FIG. 14. Due to relatively large ratio (27 to 1) of capacitance between the MCP and MCP1 (or MCP2), $I_{OUT}$ is filtered by the MCP capacitor, causing an almost constant $I_{REF}$ (refer to FIG. 14) current flow through the source terminal of MP1 transistor. The magnitude of the $I_{REF}$ current is given by:

$$I_{REF} = (V_{CC} - 2*V_{TP})*C_R*F = (V_{CC} - 2V_{TP})/R_{SC} \quad (3)$$

where $C_R$ is the capacitance at node CP1 or CP2, F is the rate of SCLK, and $R_{SC}$ is the (effective) resistance of the switched-capacitor resistor circuit, SCRES 240, connected from the J1 node to $V_{SS}$. The value of $R_{SC}$ is given by:

$$R_{SC} = 1/(C_R * F). \qquad (4)$$

FIG. 15, a schematic of charge pump controller 260 with CAPCKT 250 embedded, uses standard current-mirror techniques to mirror the CAPCKT output current, $I_{REF}$, in the drains of transistors MN5 and MP6 used as the final stage of charge pump controller 260. The purpose of these two transistors is to supply positive (source) or negative (sink) current into the output node $V_{CNTL}$ for charging or discharging the capacitors of CAP unit 203 in FIG. 5, thereby controlling the delay of the voltage controlled delay line, VCDL 401.

Referring back to FIG. 15, the direction of the current flow is controlled by control signals SP, GN, SN and SP produced at the output of MSFF 230 of phase detector 201 of FIG. 8. With GP and GN low and SN and SP high, input control transistor MP5 is on and MN4 is off. As a result, node J4 is connected to $V_{CC}$ disabling the current-mirroring operation of output transistor MP6. However, GN being low and SN being high cuts off transistor MN4. As a result, MN4 does not interfere with the $I_{REF}$ current mirroring operation of MN5 at node J2. In this manner, MN5 mirrors the reference current $I_{REF}$ flowing out of MP1 of CAPCKT 250 causing the $V_{CNTL}$ node in circuit CAP 203 to discharge, thereby shortening the VCDL 401 delay. Reversing the polarities of GP, GN, SN and SP causes MN4 to close, connecting the J2 node to $V_{SS}$, disabling MN4 and enabling MP5 to mirror $I_{REF}$ through MP6 to node $V_{CNTL}$. Because $V_{CNTL}$ is positively charged, the VCDL 401 delay is increased.

In order to achieve immunity to process and environmental variations, the current mirroring transistors of controller 260 are laid-out using standard layout rules for matched transistors. Matching between the positive and negative current sources improves the jitter performance of the complete circuit. Static (d-c) matching between the positive and negative charge currents is achieved by choosing the same static $V_{GS}$ voltage for the P and N channels transistors. This obtains by using larger size (by factor of 2.5) P channel transistors relative to the respective N channel transistor. This is done in order to compensate the degraded mobility in the P channel transistors. However, this creates a-c unbalance. Recall that the alternating operation of the current sources may occur every other CLKTTL cycle so that compensating capacitors MN7 and MN8 are added in order to achieve a-c symmetry.

At nominal operating conditions, the activating voltage at nodes J2 and J4 respectively is 1.1 volts above $V_{SS}$ and 1.1 volts below $V_{CC}$. During the inactive time of MN5 and MP6, the voltage of J2 and J4 is approximately $V_{SS}$ and $V_{CC}$ respectively. Hence, the voltage swing controlling these transistors is only 1.1 volts (approximately) which is far less than the full swing of CMOS circuits. Although this restricted voltage swing has the beneficial effect of reducing undesired charge injection into node $V_{CNTL}$ due to the parasitic gate to drain capacitance of MN5 and MP6, this low voltage swing requires the control circuitry of MN5 and MP6 to have high noise immunity. For this reason, dual-complementary non-overlapping control signals GN and SN for MN4, and GP and SP for MP5 are provided to controller 260 by the output of MSFF 230.

For example, consider the hypothetical case in which the MN4 transistor is controlled by a single GN signal while SN is connected to $V_{SS}$. Further, assume that GN is low causing transistor MN4 to be in cut-off and allowing MN5 to sink current from node $V_{CNTL}$. Any noise, even less than the MN4 threshold at the GN node, would cause strong conduction of the MN4 transistor, disturbing the MN5 current mirroring operation. This results in a highly undesirable outcome.

If, however, the preferred embodiment is used, SN goes high when GN goes low. This puts MN4 into a strong cut-off condition because this causes the source and drain of MN4 to exchange roles. Consequently, the noise at the GN node has to exceed the 1.7 volt level ($\approx 1.1 + V_{TN}$) in order to adversely effect the operation of the MN5 current mirror. Thus, dual control signals beneficially improve the noise immunity of charge pump controller 260.

It should be further noted that GN and SN should never be high simultaneously causing MN4 to pull node J2 towards $V_{CC} - V_{TN}$. To avoid this, GN and SN must have non-overlapping timing as shown in FIG. 9(c), i.e., if SN goes low, GN may only be allowed to switch to high after SN is solidly low. Also, if GN goes low as shown in FIG. 10(c), SN may only be allowed to switch to high after GN is solidly low. Similar considerations apply to the operation of MP5 and its associated control signals GP and SP.

B.2. Waveform Generator 300

Waveform generator 300 of FIG. 5 comprises two main sub-units: state machine (STM) 301 and MUX 302, as shown in FIG. 16. The STM 301 consists of four subunits: excitation unit 310 and memory unit 320 which comprise the core units of STM 301 and, the auto-reset unit 330 followed by the decoder unit 340. MUX 302 is implemented by a 4 to 1 selector (SEL) 350 preceded by a pair of TTL to CMOS and CMOS to CMOS level converters 351 and 352 respectively.

First consider the normal operation of the waveform generator 300. The excitation unit 310 triggers the memory unit 320 with four signals: SETX#, RESETX#, SETY# and RESETY# which are derived by excitation unit 310 from the F# (CLKTTL#) and R# (CLK#) input signals and the current STM 301 state signals X, X#, Y and Y#. At normal operation, the auto-reset unit 330 operates transparently, creating signals X1, X1#, Y1 and Y1# from logically identical memory unit 320 output state signals X, X#, Y and Y#. Decoder 340, creates, from the X1, X1#, Y1 and Y1# signals, four SEL[A:D] active high, and four SEL-[A#:D#] active low signals which are routed as control signals to the MUX 302. The implementation of MUX 302 uses a standard complimentary CMOS transmission gates for the four-to-one selector 350, thus requiring four active high and four active low control signals, SEL[A:D] and SEL[A#,D#] respectively. The inputs of the MUX 302 are the external CLKTTL signal, $V_{CC}$, GND ($V_{SS}$) and the internal CLK signal. The CLKTTL signal prior to being applied to the A input of the selector (SEL) 350 is converted to the full CMOS level swing by level converter 351. For equalization of the delay contributed by the level converter 351, a CMOS to CMOS level converter is used to delay the CLK signal applied to the D input of SEL 350. The MUX 302 output, labelled A1, is used as the input to VCDL 401 (see FIG. 5).

As start-up, the task of the auto-reset circuit 330 is to ensure that the STM 301 is initialized in state 00 and the delay line VCDL 401 operates in its base locking mode. This task is performed by auto-reset unit 330 by sampling the status of the memory unit signals X, X#, Y and Y# and the status of HDET# (from the delay line VCDL 401) at the falling edge of signal F# (rising edge of CLKTTL) originating from PHD 201 (FIG. 8). The inactive HDET# signal indicates normal operation of VCDL 401 (FIG. 5). For proper operation, the sample at the falling edge of F# should yield X=Y=0 and X#=Y#=HDET#=1, otherwise, the auto-reset unit modifies the X1, Y1 signals that have been tracking their respective X, X#, Y and Y# signals, forcing X1=Y1=0 and X1#=Y1#=1 and, thereby, causing the decoder to activate the SEL[A] and SEL[A#]. This causes the buffered CLKTTL signal to be routed to the A1 output. Hence, during auto-reset start-up, the VCDL 401 is driven by the buffered CLKTTL signal A1, without regard to the actual STM 301 state. Simultaneously, the auto-reset unit activates the REFRST# signal which quickly discharges the $V_{CNTL}$ node, decreasing the delay of the VCDL 401. The routing of the buffered CLKTTL signal to the A1 node of SEL 350 and the concurrent discharging the $V_{CNTL}$ node voltage continues, until the cause for auto-reset circuit activation is eliminated. Namely, normal feed-through operation of auto-reset 330 resumes when STM 301 starts operating correctly or, X=Y=0 and X#=Y#=1 at the F# falling edge (CLKTTL rising edge) and, no harmonic locking is detected in the VCDL 401 or, equivalently, HDET# is sampled low by the F# falling edge (CLKTTL rising edge).

The logic circuit implementation of STM 301 core units 310 and 320 are shown in FIG. 17. The memory unit 320 implements the four STM 301 states by using two cross coupled NAND set/reset flip-flops (FFs). NAND gates N3 and N4 comprise X-FF 321, and NAND gates N7 and N8 comprise Y-FF 322. The required excitation logic equations for each FF is derived from the state diagram of FIG. 6 as follows: SETX=Y#*F, RESETX=Y*R# and SETY=X*R, RESETY=X#*F#. Gates N2 (together with inverter I2) and N1 implement SETX# and RESETX#, respectively. Similarly, gates N5 (with inverter I1) and N6 implement SETY# and RESETY#, respectively.

FIG. 18 shows the schematics of the remaining wave generator 300 units comprising auto-reset circuit 330 and decoder circuit 340, controlling MUX 302. For purpose of explanation, first consider normal operating conditions for STM 301 and IVCDL 400, i.e., X=Y=HDET=0 and X#=Y#=HDET#=1 at the rising CLKTTL edge (falling F# edge). In this case, MSFF 331 causes the DLYRST and DLYRST# signals to be inactive which causes gates NA9, NA10, NO1 and NO2 to become inverters that create the X1, X1#, Y1 and Y1# signals from the X, X#, Y and Y# signals. The decoder gates NO3–NO5 and NA11–NA14 generate the respective eight SEL[A:D] and SEL-[A#:D#] control signals needed for the operation of SEL 350 unit in MUX 302. Differential comparator 351 converts CLKTTL to CMOS level by comparing the TTL level CLKTTL signal to a reference voltage $V_{REFT}$. At nominal conditions, $V_{REFT}$ equals to 1.4 v, thereby, providing an optimum trip point for the worst case CLKTTL swing of 0.8 v to 2.0 v. To compensate for the delay of the comparator 351, a similar differential comparator 352 is used for the internal CLK signal. The CLK signal has a full 0 v to $V_{CC}$ swing hence, trip point of comparator 352 is set by the reference voltage, $V_{REFC}$, to a nominal value of $V_{CC}/2$.

An important aspect of waveform generator 300 normal operation is the smooth (transient free), make-before-brake operation of MUX 302 while STM 301 rotates through states 00, 01, 11, and 10. The 00 to 01 state transition may be explained, by example, with the aid of FIG. 25. The columns of FIG. 25, which are functions of the STM 301 states in the first column, are partitioned into 4 groups: the first is the state of the CLK and CLKTTL STM 301 input triggering signals; the second is the state of the X, Y, X# and Y# variables in the memory unit 320; the third is the state of signals X1, Y1, X1# and Y1# resulting at the output of auto-reset circuit 330; and the last is of the logical state of SEL[A], SEL[A#], SEL[B] and SEL[B#] decoder 340 outputs together with their interpretation as the ON or OFF states of their respective MNA, MNB, MPA and MPB switches within SEL 350. The first row of FIG. 25 corresponds to the present state (PS) 00. The next row corresponds to the transient state (TS) that results from the positive transition of CLKTTL input (negative F# transition). The third row corresponds to the condition when the next state of STM 301 is the steady state 01.

Figure shows that when STM 301 is in the stable 00 state, SEL[A] and SEL[A#] are active causing their respective MNA and MPA transistors to conduct, connecting the A input to the A1 output of the SEL 350. At the onset of a CLKTTL transition (negative F# transition), a negative transition occurs at the SETX# node (Y#=1 at the input of N2), and X, in memory unit 320, changes from high to low. Due to the finite delay of gate N3, in X memory unit 321, the X# output changes from high to low after some delay. A transient state is created while the STM 301 transitions from 00 state to 01 state. In the transient state, both X and X# are at high for a short duration. The transient state produces the following conduction states of the SEL 350 transistors: MNA=ON, MPA=OFF, MNB=ON and MPB=OFF. Thus, input A and B remains partially connected to the SEL 350 A1 output. This also means that during the transient state, a connection is created from A input to B input. However, this does not constitute a contention problem because the A input has changed from low to high and is high when the B input is connected to $V_{CC}$. Hence, the transition is smooth due to this make-before-break action. By the time gate N3 of X memory unit 321 reaches its low value, the stable 01 state is achieved. During the stable 01 state, SEL[B] and SEL[B#] are active, causing transistors MNB and MPB to conduct. $V_{CC}$ on input B is passed through to output A1 and the MNA transistor is fully disconnected. After the transition to the 01 state has occurred, the high level at the CLKTTL input is not needed because the high state is supplied by $V_{CC}$ on input B. A similar SEL 350 make-before-break operation exists in all of the remaining STM 301 transitions, i.e., 01 to 11, 11 to 10 to 00.

To summarize, the important aspects of the make-before-break operation of SEL 350 are: a) the A1 node never remains floating and b) smooth logic level transition is guaranteed because SEL 350 always switches between two inputs having the same logic level value.

At power supply start-up (wake-up), STM 301 may initially be in any one of four possible states. For example, STM 301 may begin in state 01 while CLK output driver 402 is at a low logical state. The STM 01 state causes channel B to be selected at the input of MUX 302. This routes $V_{CC}$ (high state) into VCDL 401 causing a low output at CLK driver 402 and a low state at the R input of STM 301. Referring back to the state diagram in FIG. 6, in order for state 01 to change to state 11, a positive CLK transition must occur at the STM 301 R input of STM 301. However, no state change is possible under the wake-up conditions described because no transition has been or will be delivered to the input of VCDL 401.

Start-up lock-up operation of STM 301 may also result from excessive delay in the delay line VCDL 401 during lock acquisition. At normal operation, $V_{CNTL}$ is adjusted so that the IVCDL 400 delay equals to half period of the CLKTTL signal. However, at wake-up, the delay line control voltage, $V_{CNTL}$, may be initialized to a value significantly higher than required to maintain the nominal operating condition thereby causing excessive delay through VCDL 401. In that case, the STM 301 may wake-up properly at 00 state, then properly transition to 01 and 11 state. However, at the 11 state, the STM 301 looks for negative CLK transition at the R input. Because of excessive VCDL 401 delay caused by the excessively high $V_{CNTL}$ voltage, this negative CLK transition may arrive just before or even after next CLKTTL positive transition. On this next CLKTTL positive transition, the STM 301 will definitely be in other than 00 state. Hence, the next rising CLKTTL edge will not be routed into the VCDL 401 input, as required for normal circuit operation, thereby causing a lock-up situation.

Another STM 301 lock-up sequence may occur due to excessive VCDL 401 delay. During normal operation, the waveform at the VCDL 401 input A1 has close to a 50% duty cycle as shown in FIG. 5. However, until the loop control unit 200 brings the circuit to full phase lock, the waveform at node A1 may suffer from significant duty cycle distortions. In the case of excessive VCDL 401 delay, this may result in a waveform with a short low time at the VCDL 401 input. The delay inside the VCDL 401 is mainly achieved by slowing down the transition times of the propagating signal. However, in the case of a very narrow pulse in to VCDL 401, long delays affect the high frequency response of VCDL 401 and may result in significant deterioration in the amplitude of the propagating pulse. After passing through few VCDL stages, the frequency-amplitude loss may be enough so that there is insufficient pulse energy available to trigger the next VCDL stage. Hence, no transitions will appear at the IVCDL 400 CLK output. Again, the STM 301 will not operate correctly.

To avoid entering STM lock-up due to initialization to other than 00 state or, due to excessive VCDL 401 delay as a result of excessively high $V_{CNTL}$ voltage, the auto-reset circuit 330 as shown in FIG. 18 is used in the preferred embodiment. Referring to circuit 330, inputs X, Y and HDET are applied to NOR gate NO1, and its output, DRST#, is applied to D-type MSFF 331 at its D# input node. Similarly, X#, Y# and HDET# are applied to NAND gate NA1 and its output, DRST is applied to the D input of MSFF 331. HDET is a signal generated by VCDL 401 indicating VCDL 401 is operating improperly in a subharmonic mode and is discussed separately below. Therefore, for purposes of explanation, assume HDET is low (HDET# high) thus, rendering the output of NAND gate NA1 and NOR gate NO1 dependent only upon X#, Y# and X, Y respectively. The Q output of MSFF 331 will be low (Q# at high) only when X or Y are low (X+Y=0) and, equivalently, when X# and Y# are high (X#*Y#=1) at the rising edge of CLKTTL (falling edge of F#). This represents normal operation of STM 301 in which gates NO2 and NO1 create the X1 and Y1 signals from X# and Y# signals, respectively. Similarly, gates NA10 and NA9 create the X1# and Y1# signals from the X and Y signals, respectively. Hence, in normal STM 301 operation, signals X1, Y1, X1# and Y1# logically track the respective X, Y, X# and Y# signals. If X+Y+H-DET=1, at the rising edge of CLKTTL (falling edge of F#), the MSFF 331 Q output, DLYRST, goes high (DLYRST# goes low) for an interval of at least one CLKTTL cycle. During this interval, X1 and Y1 are forced to be low and, X1# and Y1# are forced to be high by gates NO2 and NO1 and, NA10 and NA9, respectively. In normal operation, the tracking by the X1, Y1, X1# and Y1# signals of the X, Y, X# and Y# signals, respectively, is disengaged. The X1=Y1=0 and X1#=Y1#=1 levels cause decoder 340 to activate the SELA and SELA# outputs respectively causing the CLKTTL signal to be selected by selector 350 as the input to VCDL 401 at output node A1. Concurrently, the low DLYRST# signal at the Q# output of MSFF 331, forces DLYRST1 high at the gate of transistor MRST and a low S1 at the source terminal of transistor MRST, thereby, turning on transistor MRST. The drain terminal of transistor MRST, which is connected to output terminal REFRST#, is connected to the $V_{CNTL}$ node. The turned-on MRST transistor quickly discharges the $V_{CNTL}$ voltage stored on capacitors C1 and C2 of CAP unit 203. Discharging the $V_{CNTL}$ voltage reduces the VCDL 401 delay and reduces the VCDL low-pass filtering effect.

In summary, auto-reset circuit 330, when activated, constantly routes deterministic CLKTTL signal to VCDL 401 input and concurrently reduces the VCDL 401 delay by quickly discharging the $V_{CNTL}$ voltage. Routing of deterministic CLKTTL signal to VCDL 401 ensures that both positive and negative transitions are propagated in VCDL 401; while decreasing VCDL 401 delay, ensures that these transitions will propagate through the output of CLK driver 402 causing STM 301 to exit the lock-up states 01, 11 or 10.

If X=Y=HDET=0 at the rising edge of CLKTTL, the result is that Q (DLYRST) returns to low while Q# (DLYRST#) returns to high. This action resumes normal operation and tracking by signals X1, Y1, X1# and Y1# of their respective X, Y, X# and Y# signals. Also, discharging of the $V_{CNTL}$ voltage stops because the DLYRST1 signal goes low and the S1 signal goes high, cutting-off transistor MRST.

FIG. 19 shows a set of observed wake-up waveforms. The delay line control voltage, $V_{CNTL}$, and the auto-reset signal, DLYRST, are shown in FIG. 19(a). The tap waveforms observed at the output of the even numbered successive delay line segments, N2 through N10 are shown in FIG. 19(b) together with the reference clock, CLKTTL, and the synthesized delay line output, CLK, superimposed. Note in particular the CLKTTL rising edge that is propagated out of tap N2 at approximately t=185 ns is barely discernable two delay line segments later at tap N4, and disappears for the subsequent delay line taps shown. Similarly, the rising edge of N2 at approximately t=225 ns also disappears by tap N6. Despite the repeated assertion of the auto-reset control signal, DLYRST, shown in FIG. 19(a), these narrow transitions will fail to propagate through VCDL 401 and hence proper operation of STM 301 will not occur unless the delay through VCDL 401 is sufficiently reduced by reducing the $V_{CNTL}$ voltage, as shown in FIG. 19 for t>285 ns.

Referring back to the auto-reset 330 circuit schematics in FIG. 18, it should be noted that the conduction control of MRST transistor, uses two complimentary DLYRST1 and S1 signals in the preferred embodiment in order to provide a high degree of noise immunity to the operation of VCDL 401. The $V_{CNTL}$ node of VCDL 401 is the most sensitive analog node of the system. For purposes of explanation, consider an alternative network arrangement in which inverter I9 of auto-reset 330 is not used and the source terminal S1 of transistor MRST is connected directly to $V_{SS}=0$ v. Superficially, the network would appear to be functionally equivalent because when DLYRST1 is asserted high, the MRST transistor sinks significant current from the $V_{CNTL}$ node through the REFRST# terminal. Alternatively, if DLYRST is low, MRST transistor would be in its cut-off state. However, recognizing that the charge or discharge current of the $V_{CNTL}$ node is only about 100 microamperes, and that the threshold voltage of the MRST transistor is approximately 0.6 v, a small noise perturbation at the MRST gate could cause significant false conduction of the MRST transistor thereby seriously disrupting the circuit's operation.

Referring back to the preferred circuit implementation shown in FIG. 18, that uses the I9 inverter to drive the S1 terminal of transistor MRST, note that in normal operation, when DLYRST1 node is at 0 v, the S1 node is held at $V_{CC}$, causing the drain and source nodes of MRST to exchange roles. This, in turn, causes transistor MRST to stay in deep cut-off, and thus highly immune to gate noise perturbations. Noise levels must exceed the sum of the $V_{CNTL}$ voltage (nominally 2−3 v) and MRST threshold voltage (0.6 v) or approximately 2.6 to 3.6 volts, a significant improvement over the grounded source configuration. The high noise immunity operation of transistor MRST is very similar to the high noise immunity operation of the MN4 transistor in the charge pump controller 260, due to the use of complimentary drive signals GN and SN.

In order to provide transient-free smooth make-before-break operation of MUX 302 while exiting the auto-reset mode, the DLYRST and DLYRST# outputs of MSFF 331 are each delayed by two inverters, I4, I5 and I6, I7 respectively before releasing normal operation of the Y1 and Y1# signals.

It should be noted that the DLYRST signal may also be activated by an active HDET# signal in a similar fashion to that described above for an STM malfunction. The HDET# signal is activated if improper subharmonic locking of VCDL 401 is detected. This undesirable VCDL 401 mode of operation is described in section B.3 below.

B.3. Delay Line Circuit

The circuit implementation details of the twelve stage voltage controlled delay line, VCDL 401, of FIG. 5 is shown in FIG. 20. The actual delay line (DL) 410, comprises twelve concatenated identical inverters I1 through I12. Each of the above inverters is loaded by a pair of P-channel and N-channel transistor-capacitors CP1 through CP12 and CN1 through CN12 respectively. The amount of loading on the output of each inverter by the capacitors is controlled by transistors M1 through M12 in response to the input $V_{CNTL}$ voltage. The output node of each delaying inverter stage labeled by N1 through N11 is buffered by the inverters I13 through I24 before being applied to the input of subharmonic detection network 420, used for sensing proper base mode operations of DL 410.

FIG. 21 shows the overall delay $T_{DT}$ of DL 410 as function of the $V_{CNTL}$ voltage for power supply voltages of 5.0 and 4.9 volts. $T_{DT}$ is given by:

$$T_{DT}=T_{AA1}+T_{RRVCDL}+T_{RFCLKDRV}+T_{DA1}+T_{FFVCDL}+T_{FRCLKDRV} \quad (5)$$

where: $T_{AA1}$ and $T_{DA1}$ are the delays from nodes A and D of MUX 302 to node A1, respectively; $T_{RRVCDL}$ and $T_{FFVCDL}$ are the rising and falling propagation delays respectively inside VCDL 401 contributed by DL 410; $T_{RFCLKDRV}$ and $T_{FRCLKDRV}$, respectively, are the delays due to the rising-to-falling and falling-to-rising edge delays of CLKDRV 402. The main contributors to the overall delay are $T_{RRVCDL}$ and $T_{FFVCDL}$. Both of these delays are almost equal due to the use of an even number (twelve) of stages in the DL 410.

FIG. 21 shows that for $V_{CNTL}$ below 0.6 v, $T_{DT}$ is minimal and almost constant because if the $V_{CNTL}$ voltage is below the threshold voltage (0.6 v), the M1-M12 transistors in FIG. 20 are cut-off and hence inverters I1-I12 have minimal delay because load capacitors CP1-CP12 and CN1-CN12 are isolated from nodes N1-N11. Above threshold, the conduction of control transistors M1-M12 increases causing transistor-capacitors CP1-CP12 and CN1-CN12 to appear as "voltage controlled" load capacitors at N1-N11 nodes. The increased capacitance, slows down the transition time of the inverters I1-I12, causing an increase in delay. FIG. 21 shows that the delay increases monotonously with increase in the $V_{CNTL}$ voltage.

A serious concern in the use of a phase-lock-loop for the 1×CLK generation is the high sensitivity of CLK phase to power supply noise. In a PLL implementation, power supply noise modulates the CLK phase that translates to CLK jitter. An important feature of the preferred embodiment is the achievement of a significant reduction of CLK jitter due to power supply noise.

Circuit noise immunity is attributable to: a) the use of a voltage controlled delay line (VCDL) rather than a voltage controlled oscillator (VCO) in the loop for CLK signal generation; and b) the use of split capacitors, C1 and C2, of CAP 203, as shown in FIG. 5.

First consider the improved noise immunity due solely to the use of a delay line by assuming that both C1 and C2 in CAP unit 203 are attached in parallel between the $V_{CNTL}$ node and the ground node. Further assume that a sudden drop of 100 millivolts occurred on the $V_{CC}$ voltage at the beginning of a given CLKTTL cycle. Designate this moment as t=0. (Sudden changes in $V_{CC}$ voltage can easily happen on the internal power supplies of a microprocessor due to significant change in power supply consumption from cycle to cycle). For both PLL and delay line loop clock generators, the loop filter response time is of the order of tens of microseconds. Assuming that the CLKTTL frequency is 50 MHz, (Tp=20 ns) no significant change may occur in the $V_{CNTL}$ voltage in either circuit until a few CLKTTL cycles after the $V_{CC}$ change has occurred. In the PLL circuit (FIG. 3), constant $V_{CNTL}$ voltage leads to constant VCO frequency. However, for the delay line loop clock generator, constant $V_{CNTL}$ produces constant delay. This fact leads to a significant difference in power supply noise immunity of the two implementations.

Consider for example, a VCO based PLL circuit, working at a clock frequency of 50 MHz (Tp=20 ns). Assuming that a −100 mV step change in $V_{CC}$ results in a 2.5% change in VCO frequency, the VCO frequency is lowered to 48.75 MHz which has a period of 20.5 ns. The timing of successive CLK rising edge transitions will occur at approximately t=20.5 ns, t=41.0 ns, t=61.5 ns etc . . . while the CLKTTL transitions, will occur at regular timing of t=20 ns, t=40 ns, t=60 ns etc . . . Hence, the phase error between the internal CLK and external CLKTTL diverges because the phase error accumulates from cycle to cycle in the VCO based PLL circuit. After a number of cycles, the operation of the PFD 20 in the PLL circuit of FIG. 3 will reduce the $V_{CNTL}$ voltage on the loop filter (LPF) to a voltage suitable for phase locking at the reduced $V_{CC}$ voltage. However, this adjustment may take a significant number of CLKTTL cycles. Meanwhile, the CLK phase error will grow to a magnitude causing improper operation of the microprocessor system shown in FIG. 1, due to input/output timing violations.

On the other hand, although the delay line in the preferred embodiment would have the same delay sensitivity to a −100 mV step voltage change in $V_{CC}$, at every CLKTTL cycle a new rising CLKTTL transition is injected into the circuit and delayed by the delay line by 20.5 ns delay. Hence, after the $V_{CC}$ step change, successive CLK transitions will occur at timing of t=20.5 ns, t=40.5 ns t=60.5 ns etc . . . (i.e., at 20 ns intervals). The inherent noise immunity of the delay line implementation is significantly better because there is no phase error accumulation. In an actual implementation, the phase detector will correct the phase error at approximate rate of 0.1 ns per CLKTTL cycle. Hence, the original 0.5 ns error will be eliminated after five CLKTTL cycles because transitions will occur at t=20.5 ns, t=40.4 ns, t=60.3 ns, t=80.2 ns, t=100.1 ns and t=120 ns as a result of the −100 mV $V_{CC}$ step change. A 0.5 ns CLK phase error can be generally tolerated by the microprocessor system and the microprocessor will not fail in response to the $V_{CC}$ transient.

Additional noise effect reduction is achieved in the preferred embodiment by using split capacitors C1 and C2 in CAP unit 203 of FIG. 5. By way of explanation, again consider a sudden drop of 100 millivolts in power supply voltage, $V_{CC}$, at the beginning of a given CLKTTL cycle. FIG. 21 shows that for the same $V_{CNTL}$ voltage the overall delay, $T_{DT}$ is larger if power supply voltage is lower. However, the use of equal valued split capacitors (C1 and C2), causes half of the power supply transient step (−50 millivolts) to be injected into the $V_{CNTL}$ node. FIG. 21 shows that decreasing the $V_{CNTL}$ voltage tends to counteract the effect caused by the transient step voltage decrease in $V_{CC}$, thereby minimizing the resulting change in delay so that $T_{DT}$ is almost the same as it was before the $V_{CC}$ change occurred. The improvement has been confirmed by measurements on actual silicon and shows that this noise cancellation technique is very effective at Tp=40 ns (F=50 MHz) achieving an almost perfect cancellation in delay error. At Tp=40 ns (F=25 MHz), half of the power supply transient noise effect was cancelled by using the split capacitor technique.

It should be noted that in the case of the PLL of FIG. 3, the presence of R2 resistor in the LPF 22 circuit of PLL, prevents the use of the split capacitor technique in the PLL circuit.

As previously explained, the delay inside the VCDL 401 (mainly contributed by DL 410) should be roughly equal to half the period of CLKTTL signal. However, at power-up start-up, the $V_{CNTL}$ voltage is unpredictable and may significantly exceed the level needed for normal operation. For values of $V_{CNTL}$ voltage which cause a delay of roughly (3/2) *Tp, (5/2) *Tp, (7/2) *Tp, etc. . . . inside the DL 410, the circuit may initialize into so called subharmonic locking mode. It is an object of the current invention to provide an automatic means for detecting improper operation and resetting the control loop to normal base mode operation.

FIG. 22 shows the waveforms developed at the even nodes (N2, N4, . . . , N10) of delay line 410 in FIG. 20, together with the CLKTTL, CLK, A1 and A2 input and output waveforms. FIG. 22(a) shows the waveforms for normal base mode operation, while FIG. 22(b), shows the same set of waveforms when operating in the 3rd subharmonic mode in which the VCDL 401 delay, $T_D$, is equal to 3/2 of the CLKTTL period Tp. In the normal base mode the circuit locks to an external clock signal (CLKTTL) with a period of $T_{p0}=2*T_D$. For the subharmonic mode in FIG. 22(b), the delay through VCDL 401 is assumed to be initialized to the same value, $T_D$, but the clock signal, CLKTTL, is assumed to have a period $Tpn=(1/(2n+1))*2T_D$ for n=1, 2, . . . . (Subharmonic refers to $1/T_{p0}<(2n+1)/2T_D$).

If by chance, a negative transition is introduced in CLK half way between the onset of period #1 and period #2 at wake-up, as shown in FIG. 22(b), this negative CLK transition will occur while the STM 301 (FIG. 5) is in state 11. Hence, the transition will be recirculated back into the A1 node of VCDL 401 and will concurrently trigger STM 301 rotating the STM 301 state to the next state (01). The recirculated negative CLK transition, will arrive at the CLK node as positive transition simultaneously with the arrival of the CLKTTL onset transition in period #3. The low level of CLKTTL in between periods #1 and #2 transfer STM 301 to state 00 preparing the circuit for the CLKTTL onset transition of period #2, which will arrive to the CLK (R) node as negative transition in the middle of CLKTTL periods #3 and #4. By the beginning of period #3, the third subharmonic mode (Tp=(⅓)*2*$T_D$) is established and will continue indefinitely as a result of CLKTTL and CLK waveforms being suitable for "correct" operation of STM 301 and phase detector 201. In a similar fashion other odd-subharmonic modes may be initiated.

Because these subharmonic modes are believed to be more difficult to stabilize and to have higher CLK jitter, the base-mode is the preferred mode of operation. Network 420 of FIG. 20 is provided for the detection of subharmonic mode operation.

From FIG. 22(a), when operating normally, it may be seen that at the negative transition of CLK, all tap nodes N2 through N10 and A2 are high. However, from FIG. 22(b), it may be seen that at the negative transition of CLK, not all node states (N6 and N8) are high. In general, subharmonic modes will have one or more states low at this transition, thus providing the basis for detecting subharmonic mode operation. Referring back to FIG. 20, it is sufficient to sample an AND function of all tap node states into flip-flop (FF) 421 at the CLK falling edge. The sampled output is the HDET# signal. If HDET# output is asserted, the circuit is in a subharmonic mode or is malfunctioning. Malfunctioning may occur at the power-up start-up as previously described in section B.2.

FIG. 20 shows that prior to being applied to the subharmonic detection circuit 420, the DL 410 taps are buffered by the I13 through I24 inverters. The inverter buffering is used in order to reduce the amount of capacitive loading on the DL 410 taps by the gates of subharmonic detection circuit 420. For the same drive capability, an inverter has lower input capacitance compared with any other type of gate. Use of the inverters I13 through I24 requires (according to the DeMorgan rule, A*B=(A#+B#)#) that the subharmonic detect AND gate function be charged to a NOR function. The NOR gate implementation in the subharmonic detect circuit 420, is performed by gates NO2, NO4, NO6, NO8, NO10, NO12 and NA3, NA5, NA7, NA9, NA11 in a so called, daisy-chain implementation. The alternating polarity of the DL 410 taps and the inverting action of the NOR gate requires alternating NOR and NAND type gates for implementing a twelve input daisy-chain NOR gate as shown in FIG. 20. Flip-Flop 421, a standard positive edge triggered MSFF, samples the output of NO12 at the falling edge of CLK due to inverting operation of inverter I26. Also note that the daisy-chain implementation of the subharmonic detection logic takes advantage of the fact that the outputs from tap to tap are delayed more than the delay in the corresponding detection logic, thus permitting a simpler implementation.

C. Inherent Delay Line Jitter

Equation (2) expresses the delay line jitter due to charging and discharging $V_{CNTL}$ about its nominal value when operating in a stable locked mode. It is a function of: delay line control sensitivity, K; charge and discharge current, I; the charge/discharge interval, $\Delta t$; and the effective capacitance, C, of CAP 203. Because the value of I is the mirrored value of $I_{REF}$, the substitution of Equation (3) into Equation (2) yields $$\Delta T_{DT} = K(V_{CC} - 2^*V_{TP})^*F^*\Delta t^*C_R/C \quad (6)$$

Equation (6) shows the major factors contributing to delay line jitter.

Simulations show that the delay line sensitivity, K, varies inversely with $V_{CC}$. As a result, the product $K^*(V_{CC}-2^*V_{TP})$ is relatively insensitive to variations in $V_{CC}$. Because $\Delta t$ is an integer multiple of the CLKTTL period, 1/F, the product $F^*\Delta t$ tends to be a constant that is independent of the CLKTTL frequency, F. Lastly, the ratio of $C_R/C$ is first order independent of variations in process, $V_{CC}$, temperature and frequency because of conservative layout dimensions. Consequently, these factors do not adversely affect inherent jitter performance.

In order to understand the possible limits on jitter due to the range of integer multiples of CLKTTL clock period, 1/F, that $\Delta t$ may realize, it is necessary to consider several known contributing factors including: phase detector (PHD 201) sensitivity, charge pump controller current imbalance, and the effects of delay between PHD 201 input and charge pump 202 consequential output.

Referring to FIG. 8, consider the case when nodes DN and UP experience a simultaneous onset of a low to high transition, resulting in a meta-stable (undefined) state for MSFF 230. The final output state of MSFF 230 is unpredictable. The circuit will ultimately decide, with equal probability, to either increase or decrease $V_{CNTL}$. Hence, it may decide to continue the action of the previous cycle or change to the opposite action during the current cycle. If it continues the action of the previous cycle, $\Delta t$ spans a 2/F period, otherwise $\Delta t=1/F$.

Mismatches in the values of $I_{up}$ and $I_{dn}$ of FIG. 5 may also cause $\Delta t$ to increase, as shown in FIG. 23. Assume that the simultaneous transitions of DN and UP occur again creating the meta-stable condition in MSFF 230 which, by chance, is resolved by activating $I_{up}$ causing $V_{CNTL}$ to increase. The increase in delay through VCDL 401 will cause CLK to lag CLKTTL during the first cycle (time interval 0 to 1). As a consequence, $I_{dn}$ will be activated at the beginning of the next period (t=1), causing a downward ramp in $V_{CNTL}$. Because $I_{dn}<I_{up}$, the downward slope of $V_{CNTL}$ is less than the prior period upward slope and hence extends the downward slope through two periods ($1 \leq t \leq 3$). It is highly unlikely that $\Delta t$ would be as long as, or longer than, three periods because this would require a gross imbalance ($I_{up} \geq 2^*I_{dn}$).

The practical implementation of phase detector 201 and charge pump 202 introduces delay between the CLKTTL onset transition and the switching of the $I_{up}$ and $I_{dn}$ as shown in FIG. 24. A delay of approximately 7 ns, a significant fraction of the CLKTTL 20 ns period, was observed. The effect of this delay is demonstrated over five consecutive CLKTTL time periods.

FIG. 24 begins at CLKTTL period #0 with CLKTTL and CLK producing a metastable condition. The outcome, in this example, unpredictably causes $I_{up}$ to continue to charge $V_{CNTL}$ upward causing the next CLK onset transition in period #1 to lag the CLKTTL onset transition. As a result, phase detector 201 causes the deactivation of $I_{up}$ and the activation of $I_{dn}$, 7 ns after the #1 period CLKTTL transition.

The $V_{CNTL}$ waveform controls the delay of invertors I1 through I12 of delay line 410, as shown in FIG. 20. From FIG. 22(a), it may be seen that the states of the inverters N2, N4, ..., N10 do not switch simultaneously with a change in state of the input signal at terminal A1. The state transitions are staggered due to the cumulative affect of the delays through inverters I1 through I12. As a result, the transitions in CLK as it passes down the tapped delay line are affected by different portions of the $V_{CNTL}$ waveform. The delay experienced by the transition at each inverter varies in accordance with value of $V_{CNTL}$ being applied to the particular inverter through which the CLK transition is propagating. In other words, after the beginning of a positive slope in $V_{CNTL}$, the delay seen by the onset transition of CLK through inverter I2 is somewhat less than the same transition seen later through inverter I12. Thus, the actual delay experienced between onset transition of CLKTTL is equivalent to an average value of $V_{CNTL}$ over that same period as indicated by the values V0 through V4 for the $V_{CNTL}$ waveform shown in FIG. 24. Consequently, CLK experiences increasing lag relative to CLKTTL into period #2 even through $I_{up}$ and $I_{dn}$ switched from a positive to negative slope 7 ns after the beginning of period #1. By the beginning of period #4, the delay, by chance, has been reduced enough so that a new metastable condition exists with the onset of CLK and CLKTTL occurring together. In this case, the outcome is unpredictably decided in favor of continuing $I_{dn}$ active, causing $V_{CNTL}$ to continue downward for another period. At the beginning of period #5 the issue is resolved by phase detector 201 recognizing that CLK leads CLKTTL and consequently results in a change 7 ns later. In this case, the downward slope of $V_{CNTL}$ lasted for 4 periods (4 * Tp). On the other hand, if the metastable condition occurring at the beginning of period #4 had been resolved differently, the transition would have occurred one period earlier. These uncertainties introduce random jitter about the mean value of the delay experienced by CLK in delay line 410 when CLK is nominally synchronous with CLKTTL.

What is claimed is:

1. Synchronous clock generator for synchronizing a delayed and inverted synthesized 50% duty cycle clock signal with a reference clock signal, each clock signal having a first and second state transition during each clock period, comprising:
    an inverting controllable delay line with a nominal delay of one half of a period of the reference clock having the synthesized clock signal at its input and a delayed inverted replica at its output;
    a delay line control loop comprising a delay line controller coupled to the inverting controllable delay line for producing at the delay line output an inverted synthesized clock waveform with its first transition synchronous with a corresponding first transition of the reference clock signal, the delay of the delay line controlled by the delay line controller by comparing the reference clock first transition with the inverted synthesized clock signal at the output of the delay line; and
    clock waveform generator comprising a clock waveform generator coupled to the inverting controllable delay line for synthesizing a 50% duty cycle clock waveform by using the inverting delay line to produce a half period delayed in an inverted replica of the reference clock first transition to synthesize the second transition of the synthesized waveform.

2. The synchronous clock generator recited in claim 1 wherein the delay line control loop further comprises:
    a phase detector with a first and second input port, a first input port connected to the reference clock signal, a second input port connected to the inverted synthesized clock signal, for comparing the arrival times of corresponding first transitions of the two inputs and generating an output control signal representative of the first transition arrival time differences; and
    a low-pass filter connected to the output of the phase detector for producing at its output port, a smooth output signal representative of the average of the time differences that is applied to the input of the inverting controllable delay line for controlling the delay.

3. The synchronous clock generator recited in claim 2 when the phase detector means comprises a master slave flip-flop with complimentary output signals.

4. The synchronous clock generator recited in claim 3 further comprising:
    a master-slave flip-flop with dual-complimentary non-overlapping output control signals; and
    a charge pump circuit capable of accepting from the master-slave flip-flop the dual-complimentary non-overlapping signals for controlling current mirroring transistors for increased noise immunity, with its output connected to the low-pass filter means.

5. The synchronous clock generator recited in claim 1 wherein the 50% duty cycle waveform synthesizer further comprises a four-way selector switch controlled by a state machine which determines the high and low states and high-low transitions of the synthesized clock waveform output signal, the selector switch input comprising the reference clock, the synthesized clock, a signal representative of the logic low state, and a signal representative of the logic high state, and the inputs appropriately selected by the selector switch in accordance with the state machine instructions.

6. The synchronous clock generator recited in claim 4 wherein the charge pump circuit comprises:
    a first network for supply a reference current;
    a replica circuit for producing a replica current image of the referenced current and for switching the replica current at its output to provide a balanced second network with selectable charge and discharge current images that are selected in response to the phase detector output control signals; and
    a capacitor network coupled to the output of the second network for accumulating the charge and discharge currents and for producing an output delay line delay control signal voltage.

7. The synchronous clock generator recited in claim 2 wherein the phase detector comprises:
    an edge triggered master flip-flop with a sampling clock input, a first and second data input, and a first and second output, the first input being coupled to the input reference clock signal and the second input being coupled to the delayed and inverted synthesized clock signal;
    an edge triggered slave flip-flop with a sampling clock input, a first and second data input, the first input being coupled to the master flip-flop first output and the second data input being coupled to the output of the master flip-flop second output, and a first and second output;
    an output buffer and inversion network being coupled to the first and second slave flip-flop output and for producing both a buffered and a delayed buffer representative signal of both the first and second slave flip-flop output, and for producing four non-overlapping signals as controlled inputs to the charge pump circuit; and
    a sampling clock buffer for generating a sampling clock signal by delaying of the reference clocks signal in order to provide a sampling clock signal for the master and slave flip-flops.

* * * * *

UNITED STATES PATENT AND TRADEMARK OFFICE
CERTIFICATE OF CORRECTION

PATENT NO. : 5,317,202
DATED : May 31, 1994
INVENTOR(S) : Alexander Waizman

It is certified that error appears in the above-indentified patent and that said Letters Patent is hereby corrected as shown below:

| | | |
|---|---|---|
| Col. 3, Line 38 | After the word "of" | insert —present— |
| Col. 7, Line 24 | After the word "state" | Insert --11.-- |
| Col. 8, Line 21 | Delete "CLKTL" | Insert --CLKTTL-- |
| Col. 14, Line 26 | After the word "figure" | Insert --25-- |

Signed and Sealed this

Seventh Day of November, 1995

Attest:

BRUCE LEHMAN

Attesting Officer

Commissioner of Patents and Trademarks